(12) United States Patent
Takai et al.

(10) Patent No.: US 7,501,305 B2
(45) Date of Patent: Mar. 10, 2009

(54) METHOD FOR FORMING DEPOSITED FILM AND PHOTOVOLTAIC ELEMENT

(75) Inventors: Yasuyoshi Takai, Kawasaki (JP); Hiroshi Shimoda, Ebina (JP); Shotaro Okabe, Utsunomiya (JP); Koichi Matsuda, Kawasaki (JP); Hidetoshi Tsuzuki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/874,352

(22) Filed: Oct. 18, 2007

(65) Prior Publication Data

US 2008/0096305 A1   Apr. 24, 2008

(30) Foreign Application Priority Data

Oct. 23, 2006  (JP)  ............................. 2006-287448

(51) Int. Cl.
*H01L 21/20* (2006.01)
(52) U.S. Cl. .......................................... 438/57; 438/96
(58) Field of Classification Search ............... 438/5, 438/14, 7, 16, 57, 61, 62, 72, 83, 96–98, 438/485, 486; 427/255.28
See application file for complete search history.

(56) References Cited

U.S. PATENT DOCUMENTS

| | | | |
|---|---|---|---|
| 5,066,340 A | 11/1991 | Iwamoto et al. | 136/258 |
| 5,232,507 A | 8/1993 | Ohtoshi et al. | 118/719 |
| 5,360,484 A | 11/1994 | Takai et al. | 118/723 |
| 5,571,749 A | 11/1996 | Matsuda et al. | 437/113 |
| 5,589,007 A | 12/1996 | Fujioka et al. | 136/249 |
| 5,597,623 A | 1/1997 | Takai et al. | 427/575 |
| 5,637,358 A | 6/1997 | Otoshi et al. | 427/575 |
| 5,676,765 A | 10/1997 | Saito et al. | 136/258 |
| 5,720,826 A | 2/1998 | Hayashi et al. | 136/249 |
| 5,927,994 A | 7/1999 | Kohda et al. | 438/478 |
| 5,976,257 A | 11/1999 | Kanai et al. | 118/718 |
| 5,998,730 A | 12/1999 | Shiozaki et al. | 136/256 |
| 6,068,755 A | 5/2000 | Matsuda et al. | 205/333 |
| 6,103,442 A | 8/2000 | Katagiri et al. | 430/127 |
| 6,153,013 A | 11/2000 | Sakai et al. | 118/719 |
| 6,158,382 A | 12/2000 | Segi et al. | 118/723 |
| 6,159,300 A | 12/2000 | Hori et al. | 118/718 |
| 6,162,988 A | 12/2000 | Okabe et al. | 136/258 |

(Continued)

FOREIGN PATENT DOCUMENTS

JP     3-70183     3/1991

(Continued)

*Primary Examiner*—Savitri Mulpuri
(74) *Attorney, Agent, or Firm*—Fitzpatrick, Cella, Harper & Scinto

(57) ABSTRACT

A method for forming a deposited film containing microcrystalline silicon on a moving substrate by plasma-enhanced CVD includes forming a deposited film containing microcrystalline silicon on a moving substrate by plasma-enhanced CVD under conditions such that when a deposited film having a thickness of 300 nm or more is formed on a substrate while the substrate is in a stationary state, an area of the microcrystalline silicon region in which an intensity of Raman scattering attributed to a crystalline substance in the deposited film is equal to or higher than three times an intensity of Raman scattering attributed to an amorphous is 50% or more of the total area based on the area of the microcrystalline silicon region and the area of a region composed of the amorphous.

4 Claims, 7 Drawing Sheets

U.S. PATENT DOCUMENTS

| | | | |
|---|---|---|---|
| 6,223,684 B1 | 5/2001 | Fujioka et al. | 118/723 R |
| 6,271,055 B1 | 8/2001 | Yajima et al. | 438/97 |
| 6,326,304 B1 | 12/2001 | Yoshimi et al. | 438/680 |
| 6,335,281 B1 | 1/2002 | Segi et al. | 438/680 |
| 6,337,224 B1 | 1/2002 | Okamoto et al. | 438/69 |
| 6,368,944 B1 | 4/2002 | Okabe et al. | 438/482 |
| 6,399,411 B1 | 6/2002 | Hori et al. | 438/62 |
| 6,406,554 B1 | 6/2002 | Katagiri et al. | 134/24 |
| 6,435,130 B1 | 8/2002 | Takaki et al. | 118/723 |
| 6,483,021 B2 | 11/2002 | Saito | 136/258 |
| 6,530,341 B1 | 3/2003 | Kohda et al. | 118/718 |
| 6,547,922 B2 | 4/2003 | Hori et al. | 156/345.37 |
| 6,562,400 B2 | 5/2003 | Tamura et al. | 427/177 |
| 6,576,061 B1 | 6/2003 | Moriyama et al. | 118/719 |
| 6,667,240 B2 | 12/2003 | Ozaki et al. | 438/694 |
| 6,706,335 B2 | 3/2004 | Kondo et al. | 427/574 |
| 6,783,640 B2 | 8/2004 | Yamashita et al. | 204/192.13 |
| 6,803,080 B2 | 10/2004 | Kondo et al. | 427/574 |
| 6,811,816 B2 | 11/2004 | Tamura et al. | 427/248.1 |
| 6,812,499 B2 * | 11/2004 | Kondo et al. | 257/95 |
| 6,858,087 B2 | 2/2005 | Hori et al. | 118/724 |
| 6,860,974 B2 | 3/2005 | Echizen et al. | 204/192.26 |
| 6,877,458 B2 | 4/2005 | Ozaki et al. | 118/723 |
| 6,897,559 B2 | 5/2005 | Kondo et al. | 257/728 |
| 7,112,264 B2 | 9/2006 | Tsuzuki et al. | 204/206 |
| 7,211,708 B2 | 5/2007 | Shishido et al. | 588/321 |
| 2007/0169890 A1 | 7/2007 | Shishido et al. | 156/345.29 |
| 2007/0184191 A1 * | 8/2007 | Takai et al. | 427/255.28 |
| 2008/0014345 A1 | 1/2008 | Sawayama et al. | 427/248.1 |
| 2008/0096291 A1 * | 4/2008 | Takai et al. | 438/7 |

FOREIGN PATENT DOCUMENTS

| | | |
|---|---|---|
| JP | 11-243219 | 9/1999 |
| JP | 11-330520 | 11/1999 |
| JP | 2000-252484 | 9/2000 |
| JP | 3271990 | 1/2002 |
| JP | 2002-299658 | 10/2002 |

* cited by examiner

METHOD FOR FORMING DEPOSITED FILM AND PHOTOVOLTAIC ELEMENT

BACKGROUND OF THE INVENTION

1. Field of the Invention

The present invention relates to a method for forming a silicon-based deposited film and a method for forming a photovoltaic element, such as a solar cell, including a silicon-based deposited film

2. Description of the Related Art

Radio-frequency plasma chemical vapor deposition (RF plasma-enhanced CVD) serves as an excellent mass-production method for silicon-based deposited films from the viewpoint of improvement in throughput and the ease of low-temperature formation and an increase in area. With respect to solar cells as examples of products including silicon-based deposited films, solar cells including silicon-based deposited films have the following advantages over existing energy generation devices utilizing fossil fuels: an inexhaustible energy source and clean power generation processes. To expand the use of solar cells, however, it is necessary to further reduce costs. To achieve the cost reduction, an increase in deposition rate by RF plasma-enhanced CVD and the establishment of the technique for further improving characteristics are important technical issues.

For example, Japanese Patent Laid-Open No. 11-330520 discloses a method for producing a microcrystalline silicon deposited film. Japanese Patent Laid-Open No. 11-330520 discloses a technique for producing a silicon-based deposited film under conditions in which an atmosphere contains a silane gas and a hydrogen gas, the pressure in a reaction chamber is 5 Torr or more, and the distance between a substrate and an electrode is within 1 cm. The patent document discloses that using the method, the film can be formed at a high deposition rate, and a photoelectric conversion apparatus including the film has high conversion efficiency.

Japanese Patent Laid-Open No. 2000-252484 discloses deposited film-forming conditions in which the partial pressure of a $SiH_4$ gas is set in the range of 1.2 Torr to 20 Torr, the distance between electrodes is set in the range of 8 mm to 15 mm, and the amount of hydrogen diluent gas is equal to or less than four times the amount of the $SiH_4$ gas.

Japanese Patent Laid-Open No. 11-243219 discloses a layered photovoltaic element including a component having a pin junction with an i-type semiconductor layer composed of a microcrystalline semiconductor material, wherein a current is controlled by the component, the degradation of the layered photovoltaic element by light is suppressed, and the performance of the photovoltaic element is improved.

Japanese Patent Laid-Open Nos. 3-70183 and 2002-299658 and Japanese Patent Publication No. 3271990 each disclose a technique for stacking a microcrystalline silicon thin film on a single-crystal silicon substrate or a polycrystalline silicon substrate by plasma-enhanced CVD to improve performance.

The characteristics of silicon-based deposited films formed by plasma-enhanced CVD have been gradually improved by the techniques disclosed in the above-described patent documents. For example, in plasma-enhanced CVD, a relatively high pressure (e.g., 600 Pa or more) and a small distance between electrodes (e.g., 10 mm or less) compared with those in the related art are used. Under such conditions, a deposited film containing microcrystalline silicon and having relatively excellent characteristics can be formed at a high deposition rate of 1 nm/s or more. Elements, for example, photovoltaic elements such as solar cells, produced by these techniques have improved conversion efficiency, suppressed degradation rates, and higher performance.

To establish further improved performance and cost reduction, there are still problems to be solved.

For example, a roll-to-roll plasma-enhanced CVD apparatus and a plasma-enhanced CVD apparatus in which a crystalline substrate is held by a holder and a surface of the substrate is subjected to plasma treatment while the holder is conveyed will be described. As one of the features of such an apparatus for continuously forming a deposited film on the substrate, the deposited film being conveyed, the deposited film can be continuously formed for a prolonged period (e.g., 30 hours or more). Thus, the apparatus has advantages of high throughput, high productivity, ease in increasing area, and the like.

The characteristics and uniformity of the deposited film may be varied with time to form the deposited film. For example, in the case of the continuous formation of the deposited film for a prolonged period, deposited films are also formed on surfaces of inner walls of a deposited-film-forming chamber and surfaces of radio frequency electrodes. Thus, the distance between the surface of the electrode and the substrate is reduced by the thickness of the film formed on the surface of the electrode, thereby reducing the volume of the space (film-forming space) in the deposited-film-forming chamber. Furthermore, the deposited films affect the resistivity of the surfaces of the electrodes and the inner walls, thus changing the plasma state.

For example, in the case where the distance between the electrodes is 10 mm, when the deposited-film-forming time is 30 hours or more, the thickness of the film deposited on the radio frequency electrode is increased to about 0.5 to 1.0 mm, depending on conditions. Since the space is reduced by the thicknesses of the deposited films on the surfaces of the radio frequency electrodes, the volumetric capacity of the deposited-film-forming chamber is substantially reduced by 5% to 10% of the initial volumetric capacity. Furthermore, the deposited films on the surfaces of the inner walls of the deposited-film-forming chamber and the surfaces of the radio frequency electrodes each function as a resistor of some kind. Thus, the size of a plasma sheath, a bias current, a bias voltage (including a self-bias voltage), or the like is changed, thereby possibly changing the distribution of a plasma potential, a plasma state, or the like. Specifically, for example, in the case where a deposited film containing microcrystalline silicon is formed on a substrate, an increase in the thickness of films deposited on the radio frequency electrodes changes the potential distribution in the deposited-film-forming chamber (plasma space). The resulting potential difference may increase the probability of ion bombardment in which the substrate is bombarded with cations present in the plasma space. The bombardment of the cations disturbs the structure of the deposited film, thus possibly reducing the crystallinity of a specific region of microcrystalline silicon or causing the amorphization of microcrystalline silicon. Therefore, a region composed of amorphous silicon is partially or entirely formed on the substrate.

Also in the case where a deposited film is intermittently formed with an interruption of the deposition for a predetermined period of time in the course of a process, the plasma state is changed. For example, such a process includes interrupting the deposition after a deposited film is formed on a first substrate and then resuming the process after the substrate is replaced with a second substrate. In such a case, the change of the plasma state with respect to the cumulative deposition time is larger than that in the case where the deposition is uninterruptedly conducted. This may be due to the fact that a discontinuous interface is formed in the films deposited on the substrate and the radio frequency electrodes in the thickness direction.

In the method for forming a deposited film by roll-to-roll plasma-enhanced CVD, a sheet substrate may be used. Such a substrate is relatively thin (for example, 1 mm or less). General examples of the material of the sheet substrate include metals such as stainless steel; and resins such as aramid resins and polyimide resins. When the sheet substrate is used, in some cases the sheet substrate is deformed by, for example, tension applied to the substrate during the motion (or conveyance) of the substrate, thermal expansion due to heat from a heater and a plasma, or the internal stress in the deposited film on the substrate. For example, the substrate is arranged such that a deposited-film-forming side of the substrate faces downward (in the direction of gravitational force) and that the substrate faces the radio frequency electrodes. In the case of the conveyance of the substrate, the middle portion or ends of the substrate in the width direction are partially curved in some cases.

In cases of a sufficiently large interelectrode distance (e.g., 50 mm or more) or reduced thicknesses of films deposited on the surfaces of the radio frequency electrodes and the inner walls of the deposited-film-forming chamber, such deformation of the substrate has only a small effect on the plasma state.

In the case of the deposited-film-forming chamber having an interelectrode distance of about 10 mm or less, however, even a slight change in interelectrode distance due to the deformation of the substrate relatively increases the rate of change, thus possibly degrading the uniformity of the plasma (increase in nonuniformity). Furthermore, the thickness (e.g., 1 mm or more) of each of the films deposited on the surfaces of the radio frequency electrodes and the inner walls of the deposited-film-forming chamber is increased with deposition time to undesirably affect the uniformity of the plasma. When a change in interelectrode distance is 1 mm, the rate of change in interelectrode distance is as high as 10% with respect to the entire interelectrode distance (10 mm). That is, the interelectrode distance is changed by 10% of the initial distance. This locally changes the state of plasma on the surface of the substrate, thereby increasing the nonuniformity of the plasma as a whole.

The nonuniformity of the plasma state may locally change the crystal system of the film deposited. For example, although a deposited film is formed under conditions suitable for the formation of microcrystalline silicon, a deposited film composed of amorphous silicon can be locally formed. The area ratio of a region where the deposited film composed of amorphous silicon is formed to a region where the deposited film composed of microcrystalline silicon is formed increases with time. In the present invention, the regions described above are also referred to as a "region composed of microcrystalline silicon" and a "region composed of amorphous silicon".

In other words, the ratio of the area of the region composed of microcrystalline silicon to the total area (the sum of the areas of the region composed of microcrystalline silicon and the region composed of amorphous silicon) is reduced with time.

In the case where the deposited film is formed continuously and stably under conditions maintained within a predetermined range, rapid changes do not easily occur. Thus, the changes are not easily elicited because the deposited film is less affected by the changes (a small change in characteristics) in the short term. However, the change in the area ratio of the region composed of amorphous silicon to the region composed of microcrystalline silicon gradually changes the characteristics. The change in characteristics increases with time and becomes apparent. In the case of the continuous formation of the deposited film for a prolonged period of time, the proportion of the region composed of microcrystalline silicon varies depending on the stage of the film-forming process; that is, whether one is in an early, middle, or late stage of the film-forming process. Thus, the characteristics of the deposited film also vary.

As described above, in the case where the deposition is interrupted in the course of the process and is then resumed after a predetermined period of time, the change of the plasma state with respect to the cumulative deposition time is larger than that in the case where the deposition is conducted without interruption. Thus, the yield and the like are markedly affected. This may be because an interface is formed in each of deposited films on the surfaces of the radio frequency electrodes and the inner walls of the deposited-film-forming chamber by interrupting the deposition. This is believed to be due to the fact that the interface state of the deposited film is increased which changes the resistivity, adhesion, surface shape of the deposited film and provides a discontinuous interface.

In the deposited film containing microcrystalline silicon, an increase in the area ratio of the region composed of amorphous silicon to the region composed of microcrystalline silicon changes the state (e.g., grain size, crystallinity, hydrogen content, or defect density) of the microcrystalline silicon in the deposited film, thus degrading the characteristics and uniformity. When such a deposited film containing microcrystalline silicon is used as the photoactive layer of a photovoltaic element, the design characteristics (e.g., open-circuit voltage, short-circuit current, fill factor, conversion efficiency, and degradation rate by light) of the element are not obtained in some cases.

In recent years, photovoltaic elements such as solar cells have been required to have higher performance, and the allowable variation range of characteristics has become smaller. Thus, the change in characteristics significantly reduces the yield.

As employed herein, the phrase "crystalline substance" refers to a microcrystalline substance and the phrase "different crystal systems" includes microcrystalline systems and amorphous systems.

SUMMARY OF THE INVENTION

The present invention provides a method for forming a deposited film containing microcrystalline silicon by plasma-enhanced CVD on a moving substrate, wherein the change of a plasma state is reduced, and the plasma state is stably maintained for a prolonged period of time.

The present invention provides a method that prevents adverse effects resulting from the change of the plasma state on the characteristics of a deposited film or a photovoltaic element.

The present invention provides a method for stably forming a deposited film containing microcrystalline silicon and having uniform characteristics by plasma-enhanced CVD on a moving substrate for a prolonged period of time.

The present invention provides a deposited film containing microcrystalline silicon and having improved characteristics and uniformity and a photovoltaic element including the deposited film, the photovoltaic element having improved characteristics.

The present invention provides a photovoltaic element such as a solar cell with low production costs.

To overcome the above-described problems, the inventors conducted intensive studies, with the result that the present invention has been accomplished. The present invention provides a method for forming a deposited film containing microcrystalline silicon on a moving substrate by plasma-enhanced CVD, the method including a step of forming a deposited film containing microcrystalline silicon on a moving substrate by plasma-enhanced CVD under conditions such that when a deposited film having a thickness of 300 nm or more is formed on a substrate while the substrate is in a stationary state, an area of the microcrystalline silicon region in which an intensity of Raman scattering attributed to a crystalline substance in the deposited film is equal to or higher than three times an intensity of Raman scattering attributed to an amorphous is 50% or more of the total area based on the area of the microcrystalline silicon region and the area of a region composed of the amorphous.

In the method of the present invention for forming the deposited film containing microcrystalline silicon on the moving substrate by plasma-enhanced CVD, the method includes a step of forming the deposited film containing microcrystalline silicon on a moving substrate by plasma-enhanced CVD under conditions such that when a deposited film having a thickness of 300 nm or more is formed on a substrate while the substrate is in a stationary state, an area of the microcrystalline silicon region in which an intensity of Raman scattering attributed to a crystalline substance in the deposited film is equal to or higher than three times an intensity of Raman scattering attributed to an amorphous is determined by a color or reflectivity corresponding to microcrystalline silicon and is 50% or more of the total area based on the area of the microcrystalline silicon region and the area of the region composed of the amorphous.

A method of the present invention for forming a photovoltaic element including at least one pin junction by plasma-enhanced CVD on a moving substrate, at least one i-type layer being formed of a deposited film containing microcrystalline silicon includes a step of forming the deposited film containing microcrystalline silicon on a moving substrate by plasma-enhanced CVD under conditions such that when a deposited film having a thickness of 300 nm or more is formed on a substrate while the substrate is in a stationary state, an area of the microcrystalline silicon region in which an intensity of Raman scattering attributed to a crystalline substance in the deposited film is equal to or higher than three times an intensity of Raman scattering attributed to an amorphous is 50% or more of the total area calculated as above.

In the method of the present invention for forming the photovoltaic element including at least one pin junction by plasma-enhanced CVD on the moving substrate, at least one i-type layer being formed of the deposited film containing microcrystalline silicon, the deposited film containing microcrystalline silicon is formed on a moving substrate by plasma-enhanced CVD under conditions such that when a deposited film having a thickness of 300 nm or more is formed on a substrate while the substrate is in a stationary state, an area of the microcrystalline silicon region in which an intensity of Raman scattering attributed to a crystalline substance in the deposited film is equal to or higher than three times an intensity of Raman scattering attributed to an amorphous is determined by a color or reflectivity corresponding to microcrystalline silicon and is 50% or more of the total area calculated as above.

A method of the present invention for forming a deposited film containing microcrystalline silicon on a moving substrate by plasma-enhanced CVD includes a first step of forming a deposited film while a substrate is being moved, a second step of forming a deposited film while the substrate is being moved, and a third step of forming a deposited film while the substrate is in a stationary state, the third step being performed before the first step or between the first step and the second step, wherein conditions for forming the deposited film while the substrate is being moved are controlled on the basis of the ratio of an area of the microcrystalline silicon region in which an intensity of Raman scattering attributed to a crystalline substance in the deposited film is equal to or higher than three times an intensity of Raman scattering attributed to an amorphous to the total area calculated as above when the deposited film having a thickness of 300 nm or more is formed on the substrate while the substrate is in a stationary state in the third step.

A method of the present invention for forming a deposited film containing microcrystalline silicon on a moving substrate by plasma-enhanced CVD includes a first step of forming a deposited film while a substrate is being moved, a second step of forming a deposited film while the substrate is being moved, and a third step of forming a deposited film while the substrate is in a stationary state, the third step being performed before the first step or between the first step and the second step, wherein the maintenance of a deposition-film-forming apparatus is performed on the basis of the ratio of an area of the microcrystalline silicon region in which an intensity of Raman scattering attributed to a crystalline substance in the deposited film is equal to or higher than three times an intensity of Raman scattering attributed to an amorphous to the total area calculated as above when the deposited film having a thickness of 300 nm or more is formed on the substrate while the substrate is in a stationary state in the third step.

Further features of the present invention will become apparent from the following description of exemplary embodiments with reference to the attached drawings.

DESCRIPTION OF THE EMBODIMENTS

While the best mode for carrying out the invention will be described in more detail with reference to the drawings, the present invention is not limited thereto.

The present invention will be described in more detail on the basis of FIGS. 1 to 7.

Figure 1:
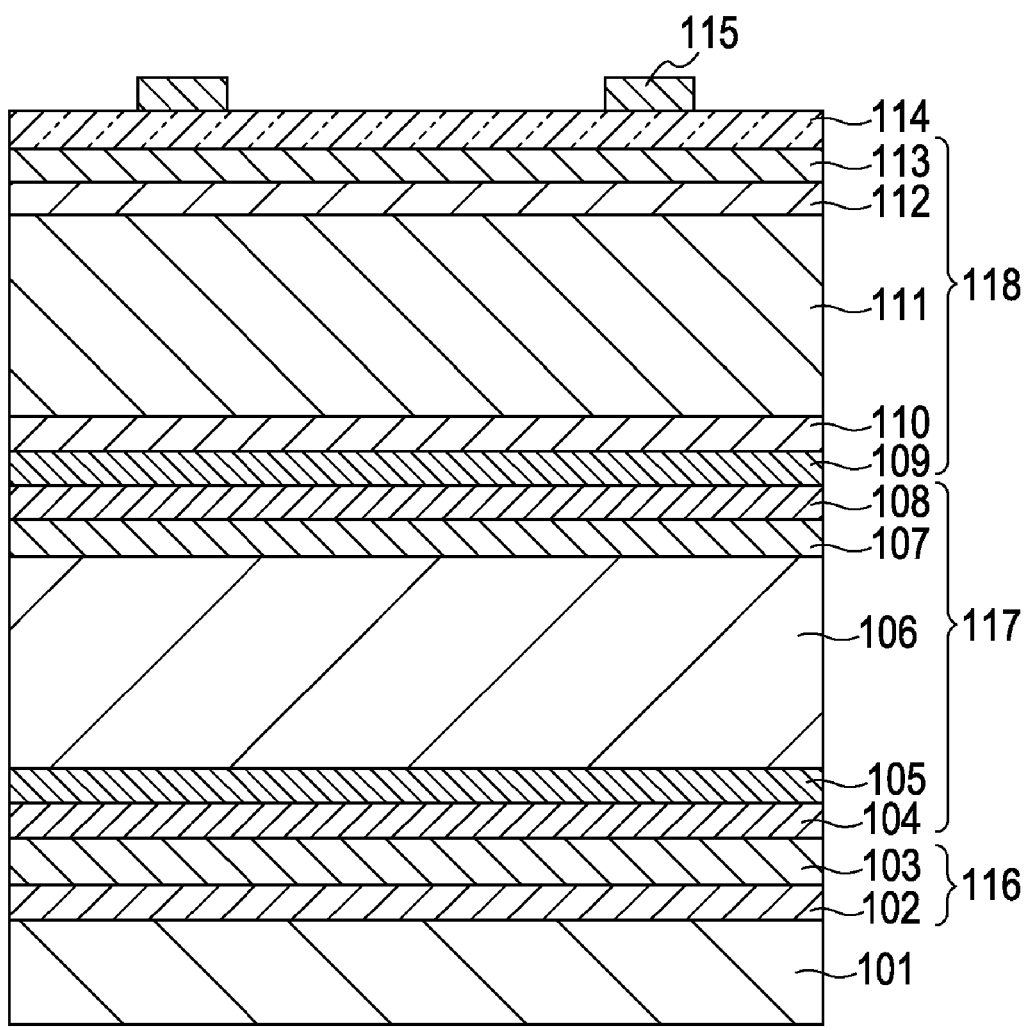
FIG. 1 shows a structure of layers of a solar cell according to an embodiment of the present invention.

FIG. 1 shows a structure of layers of a solar cell according to a preferred embodiment of the present invention.

FIG. 1 shows a substrate 101, a bottom-reflecting layer 116 including a reflecting sublayer 102 and a reflection-enhancing sublayer 103, a first photovoltaic element 117 including an n- or p-type layer 104, an n/i or p/i buffer layer 105, an i-type layer 106, a p/i or n/i buffer layer 107, and a p- or n-type layer 108, a second photovoltaic element 118 including an n- or p-type layer 109, an n/i or p/i buffer layer 110, an i-type layer 111, a p/i or n/i buffer layer 112, and a p- or n-type layer 113, a transparent electrode 114, and a collecting electrode 115.

In the present invention, at least one of the i-type layers described above is formed of an i-type layer containing microcrystalline silicon formed by a method of the present invention. The employment of the method of the present invention results in a reduction in the change of a plasma state and the maintenance of a stable plasma state for a prolonged period of time.

In the method of the present invention for forming a deposited film containing microcrystalline silicon by plasma-enhanced CVD on a moving substrate, a deposited film having excellent uniformity in characteristics can be stably formed for a prolonged period of time.

Furthermore, the characteristics and uniformity of the deposited film containing microcrystalline silicon can be improved, and the characteristics of a photovoltaic element including the deposited film can be improved.

In the present invention, at least one of the i-type layers described above is formed of an i-type layer containing microcrystalline silicon formed by a method of the present invention. Thus, the effect of the present invention can be obtained. That is, the present invention provides a photovoltaic element in which the characteristics are not degraded or are slightly degraded even when the photovoltaic element is irradiated with light for a prolonged period of time.

Figure 7:
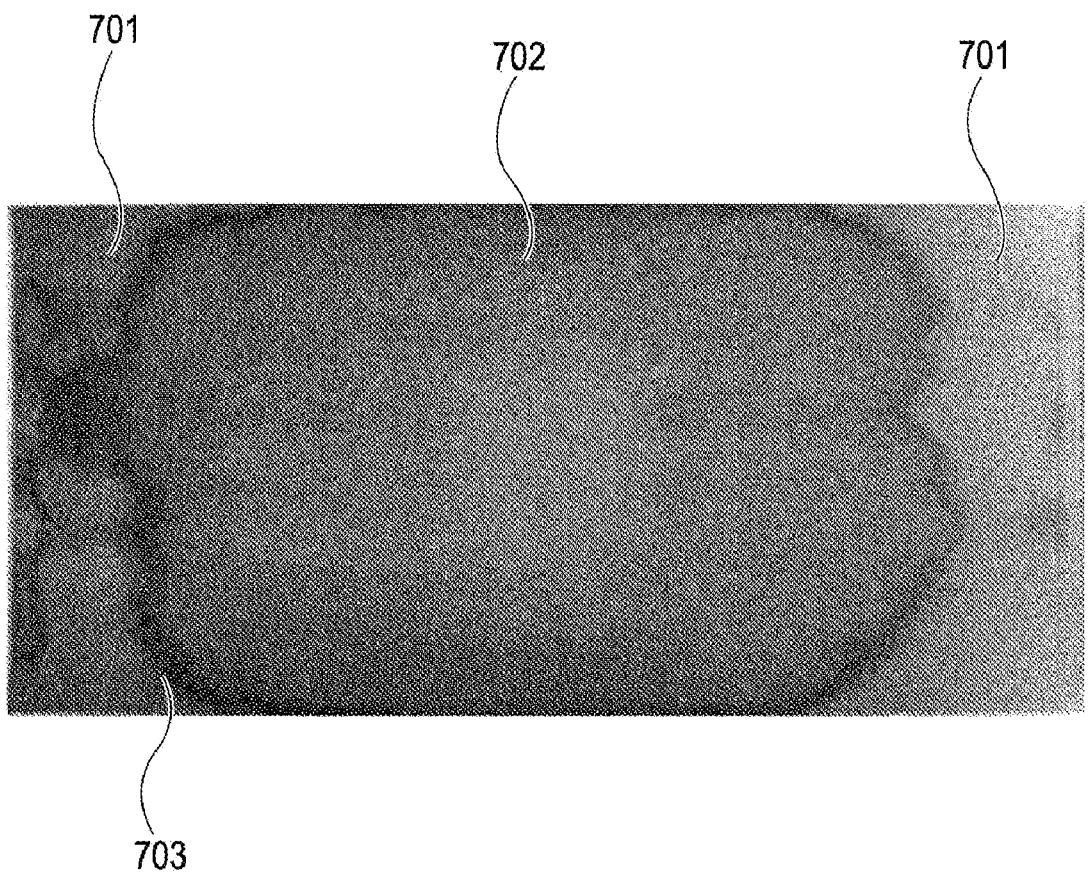
FIG. 7 shows a surface state of a deposited film of the present invention when the deposited film having a thickness of 300 nm or more is formed on a substrate while the substrate is in a stationary state.

FIG. 7 shows a surface state of a deposited film formed on a substrate being in a stationary state (hereinafter, referred to as a "stationary substrate") and having a thickness of 300 nm or more according to the present invention.

FIG. 7 illustrates regions 701 composed of amorphous silicon, a region 702 composed of microcrystalline silicon, and a boundary region 703. As shown in this figure, in the case where the plasma state is different by location, the deposited film including the regions having different crystal systems (amorphous silicon and microcrystalline silicon) is formed depending on deposited-film-forming conditions and the structure of an apparatus. FIG. 7 clearly shows that these regions have different colors.

In the present invention, the area of the region composed of microcrystalline silicon refers to the area of the region 702 composed of microcrystalline silicon shown in FIG. 7. The total area refers to the sum of the area of the region 702 composed of microcrystalline silicon and the area of the regions 701 composed of amorphous silicon shown in FIG. 7.

On the basis of past experience of the inventors, in the case where a deposited film is formed by, for example, roll-to-roll plasma-enhanced CVD on a moving substrate, the plasma state is changed with time to cause the distribution as described above. However, since the deposited film is formed on the moving substrate, it is difficult to determine whether the plasma state is nonuniform on the basis of the surface state of the deposited film even when the plasma state is changed. When attention is focused on a specific position of the substrate, the moving substrate allows the position to pass through the region composed of microcrystalline silicon and the region composed of amorphous silicon. In this case, the deposited film formed on the substrate includes a layer of the region composed of microcrystalline silicon and a layer of the region composed of amorphous silicon stacked in the thickness direction. However, each of the layers formed when the substrate passes through the regions is thin, depending on the conveyance velocity of the substrate and the plasma state of the regions. Thus, a clear boundary is not always formed in the thickness direction. In this case, both of amorphous silicon and microcrystalline silicon are present. Alternatively, the crystal system of the layer deposited earlier affects the layer deposited later at a specific rate. That is, the layer deposited later partially has the crystal system of the layer deposited earlier at a specific rate. Therefore, the regions having significantly different colors as described above are not formed in the direction of the movement of the substrate (the longitudinal direction of the substrate).

In other words, when the deposited film is formed on the moving substrate, the deposited film is apparently uniform to some extent (variations in color are not observed).

In general deposition-film-forming processes, deposited films are formed with controlled parameters, such as high-frequency power, pressure, substrate temperature, and gas flow rates, of the deposition-film-forming conditions. However, in the case of the formation of a deposited film on a moving substrate, a region composed of microcrystalline silicon cannot be apparently distinguished from a region composed of amorphous silicon for the above-described reason. Thus, the parameters cannot be directly controlled on the basis of the ratio of the region composed of microcrystalline silicon to the region composed of amorphous silicon.

An increase in deposition-film-forming time changes the area ratio of the region composed of amorphous silicon to the region composed of microcrystalline silicon as shown in FIG. 7. Specifically, the area ratio of the region composed of amorphous silicon to the region composed of microcrystalline silicon is increased.

The main reason for this may be that the deposited films having a large thickness formed on the surfaces of the radio frequency electrodes each function as a resistor of some kind and that the plasma state is locally changed by reducing the interelectrode distance by the thickness.

The change of the plasma state may also be due to a change in exhaust conductance caused by the growth of deposited films on the inner walls of a deposition-film-forming chamber and the inner wall of an exhaust port and by the adhesion of by-products such as polysilanes.

In such a situation, the distribution of power density, electrons, ions, radicals, and the like in the plasma space and the state of a bias applied to the plasma space are changed during the formation of a deposited film. Thus, a bias current decreases with time. Ions in the plasma space are not constrained by a bias voltage, thereby increasing the probability of the bombardment of the substrate with ions. This may result in the disordered structure of the deposited film to locally change the crystal system from microcrystalline to amorphous structure. If the proportion of the area of the region composed of amorphous silicon is increased above a certain level, the design characteristics of an element are not obtained.

The inventors have focused attention on the relationship and have observed a deposited film formed on a stationary substrate as well as a deposited film formed on a moving substrate. Controlling the deposition-film-forming conditions such that the area ratio of the region composed of microcrystalline silicon of the deposited film formed on the stationary substrate to the total area is within a predetermined range has overcome the above-described problems. As a result, it is possible to stably form the deposited film for a prolonged period of time. That is, the deposition-film-forming conditions are directly controlled to the optimal range on the basis of the proportion of the region composed of microcrystalline silicon.

In the present invention, the term "deposited film composed of microcrystalline silicon" refers to a deposited film composed of a non-monocrystalline silicon containing a certain percentage of microcrystalline silicon and includes a deposited film partially containing amorphous silicon. Specifically, the term "deposited film composed of microcrystalline silicon" refers to a deposited film in which the intensity (typically, at about 520 $cm^{-1}$) of Raman scattering attributed to a crystalline component observed by Raman spectroscopy satisfies the following relationship: the intensity of Raman scattering attributed to the crystalline component is equal to or higher than one times, desirably equal to or higher than three times, more desirably equal to or higher than five times, and optimally equal to or higher than seven times the intensity (typically, at about 480 $cm^{-1}$) of Raman scattering attributed to an amorphous component.

A suitable average crystalline grain diameter of a microcrystalline semiconductor for a layered photovoltaic element of the present invention is in the range of 10 nm to 500 nm. The i-type layer composed of microcrystalline semiconductor can have a columnar structure.

In the present invention, the term "deposited film substantially composed of amorphous silicon" refers to a deposited film composed of non-monocrystalline silicon that does not substantially contain crystalline silicon and includes a deposited film partially containing crystalline silicon. Specifically, the term "deposited film substantially composed of amorphous silicon" refers to a deposited film in which the intensity of Raman scattering attributed to the crystalline component is equal to or less than the intensity of Raman scattering attributed to the amorphous component.

In the present invention, the region composed of microcrystalline silicon of the deposited film formed on the stationary substrate can be distinguished from the region composed of amorphous silicon thereof by the following method. As a method for determining the ratio of the area of the region composed of microcrystalline silicon to the total area, the following method can be employed.

To distinguish between the region composed of microcrystalline silicon and the region composed of amorphous silicon of the deposited film, the deposited film formed on the stationary substrate is cut out as a sample. A plurality of points on the substrate are analyzed by Raman spectroscopy to determine the intensity of Raman scattering. Thereby, the regions can be distinguished.

In the production process, the film-forming conditions are controlled such that the ratio is in the predetermined range. Controlling the film-forming conditions results in the maintenance of the distribution of the crystal system of the deposited film or the quality of the deposited film even in the case of the formation of the deposited film for a prolonged period of time.

In the case where the take time for the deposited-film-forming step is increased by cutting out the deposited film as the sample as described above, the regions can be distinguished by the following method.

Microcrystalline silicon differs from amorphous silicon in optical band gap and surface properties of the deposited film. Thus, when the thickness of the deposited film formed on the substrate is increased above a certain level, the color or reflectivity of the surface of the region composed of microcrystalline silicon of the deposited film is different from that of the region composed of amorphous silicon (see FIG. 7). Therefore, the region composed of microcrystalline silicon can be distinguished from the region composed of amorphous silicon by focusing attention on the color or reflectivity of the surface of the deposited film. A deposited film is formed while the substrate is in a stationary state (the conveyance of the substrate is interrupted) (third step of forming the deposited film) before the step of forming the deposited film (first step of forming the deposited film). The deposited film formed on the stationary substrate is observed. The proportion of microcrystalline silicon is determined from the difference in the color or reflectivity described above. In the production process, the film-forming conditions are controlled (adjusted) such that the color is within a predetermined range (the proportion of the microcrystalline silicon is within a predetermined range).

In the case where the present invention is performed after the initiation of the formation of the deposited film, after the step of forming the deposited film (first step of forming the deposited film, the motion (conveyance) of the substrate is interrupted. Then a deposited film is formed on the stationary substrate (third step of forming the deposited film). The deposited film formed on the stationary substrate is observed. The proportion of microcrystalline silicon is determined from the difference in the color or reflectivity described above. The film-forming conditions are controlled (adjusted) such that the color is within a predetermined range (the proportion of the microcrystalline silicon is within a predetermined range). Then the formation of the deposited film on the moving substrate is resumed (second step of forming the deposited film). As described above, the third step of forming the deposited film may be performed before the step of forming the deposited film on the moving substrate. The third step may be performed in the course of the step of forming the deposited film on the moving substrate. Alternatively, the third step may be performed before and in the course of the step of forming the deposited film on the moving substrate. In the case where the time for the formation of the deposited film is relatively short and where the change of the deposited film is small during deposition, there is no need to perform the third step of forming the deposited film in the course of the process. In this case, after the third step, the first step may be performed to the end of the process. There is no need to perform the second step. That is, when the third step (formation of the deposited film on the stationary substrate) of the present invention is performed in the course of the film-forming process, the second step of the present invention is provided for convenience of explanation in order to differentiate between the film-forming step before the third step and the film-forming step after the third step.

Controlling the film-forming conditions results in the maintenance of the distribution of the crystal system of the deposited film or the quality of the deposited film even in the case of the formation of the deposited film for a prolonged period of time.

The term "color" in the present invention means at least one selected from the hue, brightness, and chromaticity of the surface of the deposited film. The region composed of microcrystalline silicon can be distinguished from the region composed of amorphous silicon on the basis of at least one selected from the hue, brightness, and chromaticity.

Similarly, the region composed of microcrystalline silicon can be distinguished from the region composed of amorphous silicon on the basis of the reflectivity of the surface of the deposited film.

In the present invention, as a method for distinguishing the region composed of microcrystalline silicon from the region composed of amorphous silicon on the basis of color, it is effective to use a calorimeter, a spectrocolorimeter, or the like as well as a visual observation method.

The discrimination between the region composed of microcrystalline silicon and the region composed of amorphous silicon will now be described in more detail. On the basis of past experience by the inventors, as shown in FIG. 7, the color is significantly changed at the boundary between the region composed of microcrystalline silicon and the region composed of amorphous silicon, depending on the thickness. This may be because (1) different wavelength ranges of light are absorbed and (2) the boundary is relatively steeply changed. At a thickness of about 300 nm or more, the region composed of microcrystalline silicon of the deposited film formed on the stationary substrate can be sufficiently distinguished from the region composed of amorphous silicon by visual observation. Thus, the relationship of the ratio of the intensity of Raman scattering attributed to the region composed of microcrystalline silicon to the intensity of Raman scattering attributed to the region composed of amorphous silicon is determined in advance. Then numeric criteria or color for reference is prepared to clarify criteria. Thereby, the area ratio of the region composed of microcrystalline silicon to the region composed of amorphous silicon can be determined by visual observation. Thus, the characteristics of the deposited film can be controlled within a predetermined range.

To strictly control the characteristics of the deposited film, the difference in color is measured with a calorimeter, spectrocolorimeter, or the like, and then the area ratio is determined.

As a method for distinguishing the region composed of microcrystalline silicon from the region composed of amorphous silicon on the basis of reflectivity, it is effective to use a spectrocolorimeter, a spectroreflectometer, or the like as well as a visual observation method.

The correlation between the intensity of Raman scattering and the color or reflectivity of the surface of the deposited film is determined in advance, so that strict discrimination can be performed.

To determine the ratio of the area of the region composed of microcrystalline silicon to the total area, the color or reflectivity of the deposited film formed on the stationary substrate is observed or measured. The relationships between the intensity of Raman scattering and a deposited film containing microcrystalline silicon having a desired crystallinity and between the intensity of Raman scattering and a deposited film composed of amorphous silicon is determined in advance. The proportions of the regions having different colors or reflectivity of the deposited film formed on the stationary substrate are determined from these relationships, and then the ratio of the area of the region composed of microcrystalline silicon to the total area can be calculated.

For example, the correlation between the intensity of Raman scattering and color or reflectivity is determined when the intensity of Raman scattering attributed to the crystalline component of the deposited film is equal to or higher than seven times the intensity of Raman scattering attributed to the amorphous component. Thereby, the area of the region composed of microcrystalline silicon, the region satisfying the conditions, and the ratio of the area to the total area can be determined.

In the present invention, the ratio of the area of the region composed of microcrystalline silicon to the total area can be desirably 50% or more, more desirably 70% or more, and optimally 80% or more.

In the present invention, to observe the surface of the deposited film formed on the stationary substrate, an observation window is formed at a passage between film-forming chambers or at a position at which the substrate is wound up, and then the substrate is directly observed by visual observation or with a calorimeter, a spectrocolorimeter, a spectroreflectometer, or the like. Alternatively, after the image data of the surface is read with a CCD camera, a scanner, or the like, observation can be made by visual observation or with a calorimeter, a spectrocolorimeter, a spectroreflectometer, or the like.

In the present invention, a step of forming a deposited film on a stationary substrate in order to determine the ratio of the region composed of microcrystalline silicon to the region composed of amorphous silicon may be performed before or after a step of forming a deposited film. For example, a third step of forming the deposited film on the stationary substrate can be performed after a first step of forming the deposited film on the roll substrate or before a second step of forming the deposited film on the roll substrate.

The third step of forming the deposited film on the stationary substrate may be performed before the initiation of the formation of the deposited film. Alternatively, the formation of the deposited film on the moving substrate (first step of forming the deposited film) is initiated. The conveyance of the substrate is interrupted after a predetermined period of time. A deposited film may be formed on the stationary substrate (third step of forming the deposited film). The conveyance of the substrate is initiated, and then the formation of the deposited film is resumed (second step of the deposited film. Alternatively, the deposited film may be formed on the stationary substrate (third step of forming the deposited film) at the end of the deposition-film-forming process. Thereby, the change of the plasma state can be observed before, in the course of, or after the formation of the deposited film, according to need.

In the case where separate substrates composed of single-crystal silicon or polycrystalline silicon and not being in sheet form are used, the substrates may be held by a holder capable of integrally holding the plurality of substrates being conveyed. In this case, as a method of the present invention for determining the ratio of the region composed of microcrystalline silicon and the region composed of amorphous silicon, the following method may be employed. Dummy substrates are attached on the holder. Deposited films are formed on the dummy substrates being in a stationary state. Then observation may be conducted in the same way as described above. In place of the use of the plurality of dummy substrates, a single or integral dummy substrate having the same size as the entire holder may also be used.

In the present invention, the thickness of the deposited film formed on the stationary substrate in order to determine the ratio of the region composed of microcrystalline silicon to the region composed of amorphous silicon can be set in the following range. An excessively small thickness causes the formation of an unstable crystal system of the film (at the early stage of the deposition, the crystal system is believed to be amorphous). A small amount of optical absorption by a deposited film having an excessively small thickness results in a small difference in color or the like based on the crystal systems. That is, it is difficult to distinguish the region composed of microcrystalline silicon from the region composed of amorphous silicon. An excessively large thickness disadvantageously causes an increase in downtime and the detachment of the film. Therefore, an optimum thickness is desirably present. On the basis of the inventors experience, the thickness of the deposited film formed on the stationary substrate can be set in the range of preferably 300 nm to 3 μm, more preferably 400 nm to 2 μm, and optimally 500 nm to 1 μm.

In the present invention, in order to control the crystal system, it is effective to control at least one parameter selected from the deposition-film-forming conditions: high-frequency power density, a bias voltage with respect to an interelectrode distance, a bias current with respect to an electrode area, high-frequency power with respect to a source gas flow rate, the ratio of a diluent gas flow rate to the source gas flow rate, substrate temperature, pressure, and the interelectrode distance. The correlation between the parameters and the crystal systems of the deposited film is determined in advance. Thereby, the ratio of the region composed of microcrystalline silicon to the region composed of amorphous silicon can be controlled within a predetermined range.

For example, in the case where the bias current decreases with deposition-film-forming time to reduce the area of the region composed of microcrystalline silicon, the value of the bias voltage set may be increased. In the case where the deformation of the substrate causes the partial detachment of ends of the substrate from a top plate and a change in temperature to reduce the area of the region composed of microcrystalline silicon, the total heat balance that contributes to the substrate may be controlled by adjusting the value of the substrate temperature set, the high-frequency power density, or the like. The term "top plate" refers to a member that supports the substrate from the backside of the substrate and is in thermal and electrical contact with the substrate to control the temperature or the like.

A suitable average crystalline grain diameter of a microcrystalline semiconductor for a layered photovoltaic element of the present invention is in the range of 10 nm to 300 nm. The i-type layer composed of microcrystalline semiconductor can have a columnar crystal structure.

In the present invention, the term "deposited film substantially composed of amorphous silicon" refers to a deposited film composed of non-monocrystalline silicon that does not contain crystalline silicon in substantial amounts and includes a deposited film partially containing crystalline silicon. Specifically, the term "deposited film substantially composed of amorphous silicon" refers to a deposited film in which the intensity of Raman scattering attributed to the crystalline component is lower than the intensity of Raman scattering attributed to the amorphous component.

In the present invention, a pressure during the formation of the deposited film can be preferably set in the range of 100 Pa to 2,000 Pa, desirably 150 Pa to 1,800 Pa, and optimally 300 Pa to 1,500 Pa.

In the present invention, the term "interelectrode distance" refers to the distance between the radio frequency electrode and the counter electrode. The substrate may be used as the counter electrode. In the present invention, the interelectrode distance can be preferably set in the range of 2 mm to 50 mm, more desirably 3 mm to 30 mm, and optimally 5 mm to 20 mm.

Figure 2:
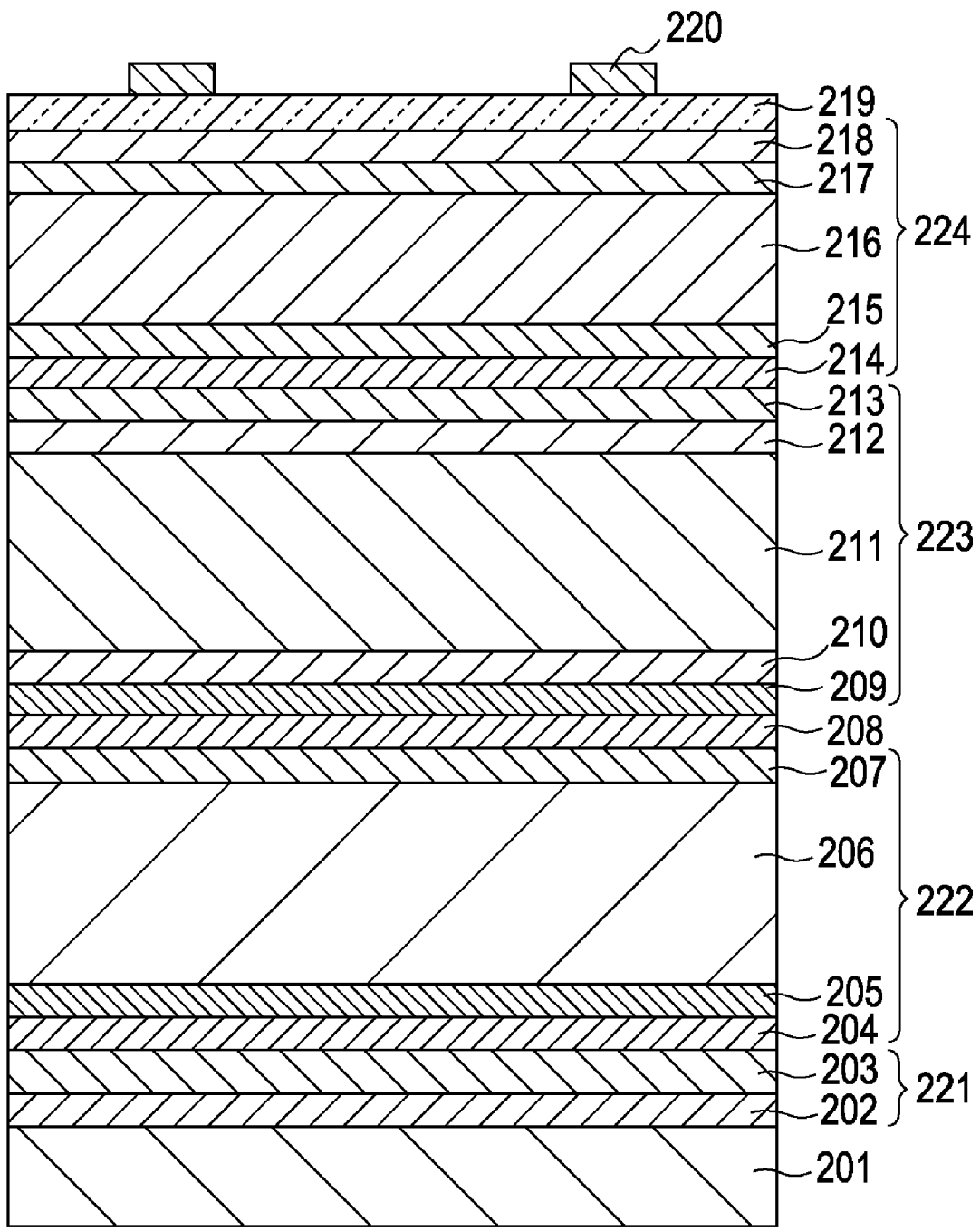
FIG. 2 shows a structure of layers of a solar cell according to an embodiment of the present invention.
Figure 3:
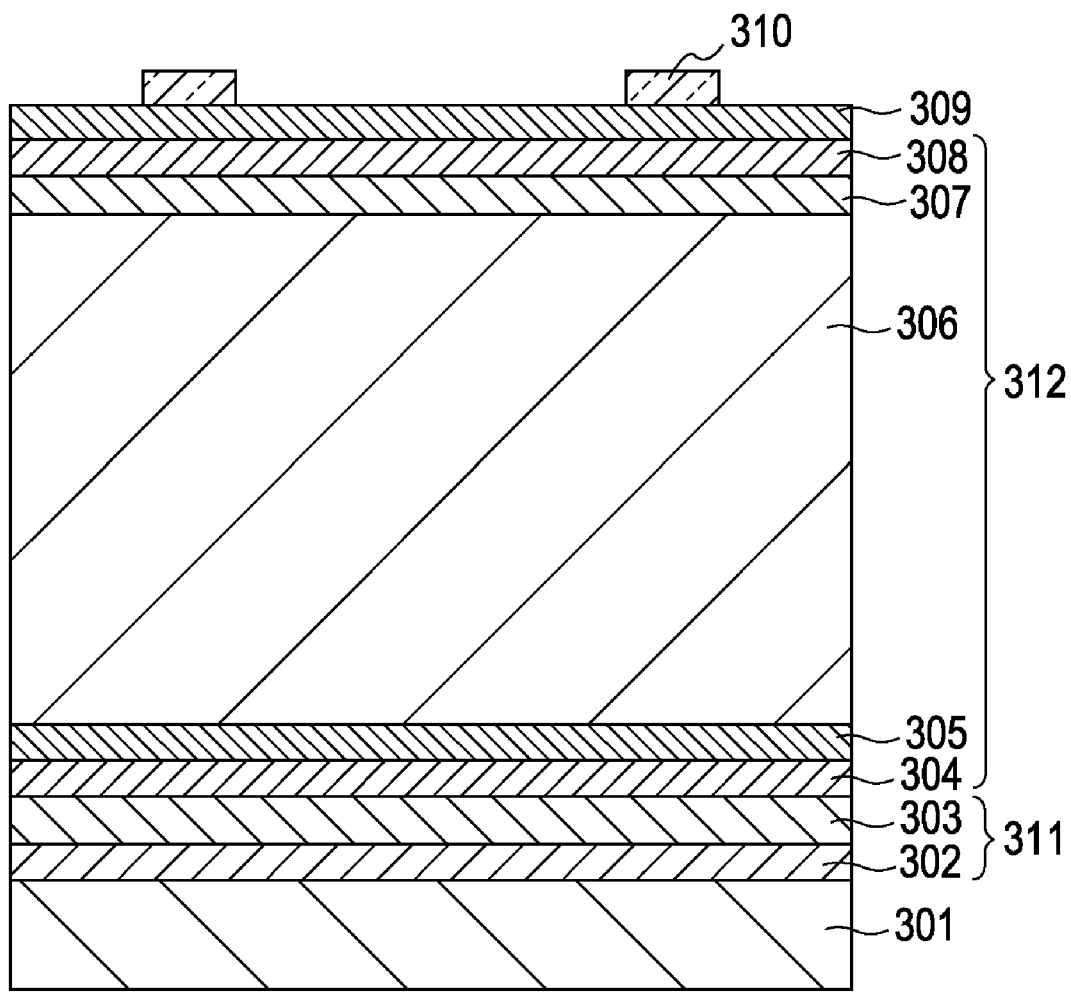
FIG. 3 shows a structure of layers of a solar cell according to an embodiment of the present invention.
Figure 4:
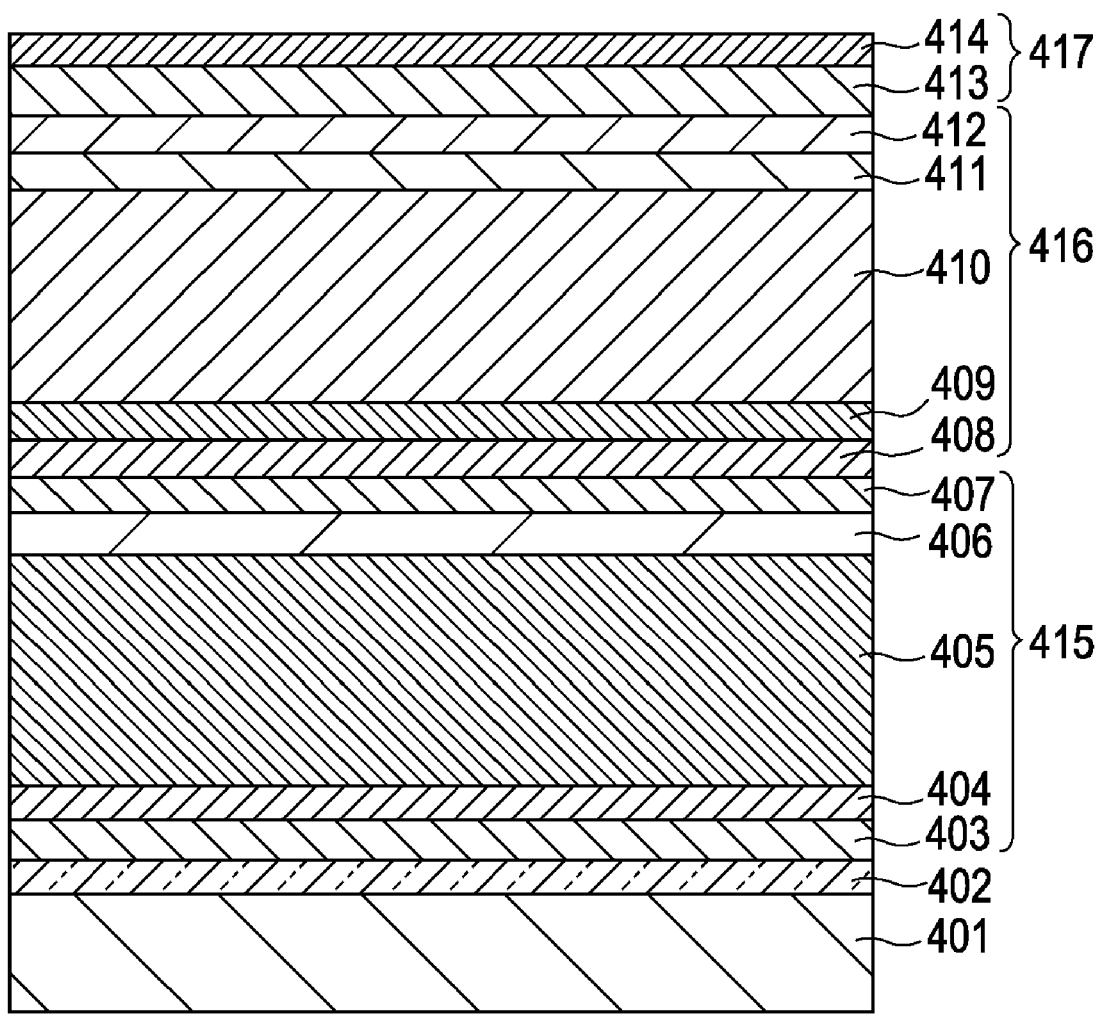
FIG. 4 shows a structure of layers of a solar cell according to an embodiment of the present invention.

In the present invention, the structure of the photovoltaic element is not limited to the double structure shown in FIG. 1. As shown in FIGS. 2 to 4 illustrating a triple structure, a single structure, and the like, the number of layers may be increased or reduced according to need.

FIG. 2 shows a substrate 201, a bottom-reflecting layer 221 including a reflecting sublayer 202 and a reflection-enhancing sublayer 203, a first photovoltaic element 222 including an n- or p-type layer 204, an n/i or p/i buffer layer 205, an i-type layer 206, a p/i or n/i buffer layer 207, and a p- or n-type layer 208, a second photovoltaic element 223 including an n- or p-type layer 209, an n/i or p/i buffer layer 210, an i-type layer 211, a p/i or n/i buffer layer 212, and a p- or n-type layer 213, a third photovoltaic element 224 including an n- or p-type layer 214, an n/i or p/i buffer layer 215, an i-type layer 216, a p/i or n/i buffer layer 217, and a p- or n-type layer 218, a transparent electrode 219, and a collecting electrode 220.

FIG. 3 shows a substrate 301, a bottom-reflecting layer 312 including a reflecting sublayer 302 and a reflection-enhancing sublayer 303, a first photovoltaic element 313 including an n- or p-type layer 304, an n/i or p/i buffer layer 305, an i-type layer 306, a p/i or n/i buffer layer 307, and a p- or n-type layer 308, a transparent electrode 310, and a collecting electrode 311.

FIG. 4 shows a transparent substrate 401, a transparent electrode 402, a first photovoltaic element 415 including an n- or p-type layer 403, a p/i or n/i buffer layer 404, an i-type layer 405, an n/i or p/i buffer layer 406, and an n- or p-type layer 407, a second photovoltaic element 416 including a p- or n-type layer 408, a p/i or n/i buffer layer 409, an i-type layer 410, an n/i or p/i buffer layer 411, and an n- or p-type layer 412, and a bottom-reflecting layer 417 including a reflection-enhancing sublayer 413 and a bottom electrode 414.

Figure 5:
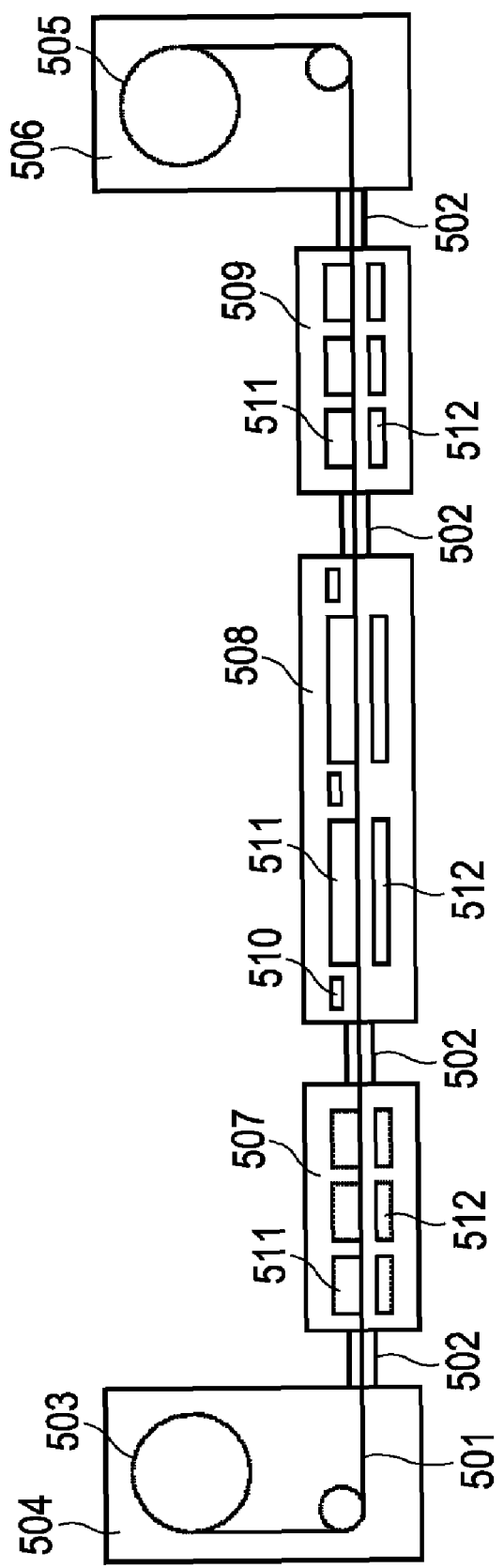
FIG. 5 shows a manufacturing apparatus according to an embodiment of the present invention.

FIG. 5 shows a manufacturing apparatus according to an embodiment of the present invention. FIG. 5 shows a substrate 501, gas gates 502, an unwinding bobbin 503, an unwinding chamber 504, a winding bobbin 505, a winding chamber 506, an n-type-layer-forming chamber 507, an i-type-layer-forming chamber 508, a p-type-layer-forming chamber 509, pre-heaters 510, thermal control units 511, and cathodes 512 (radio frequency electrodes).

Figure 6:
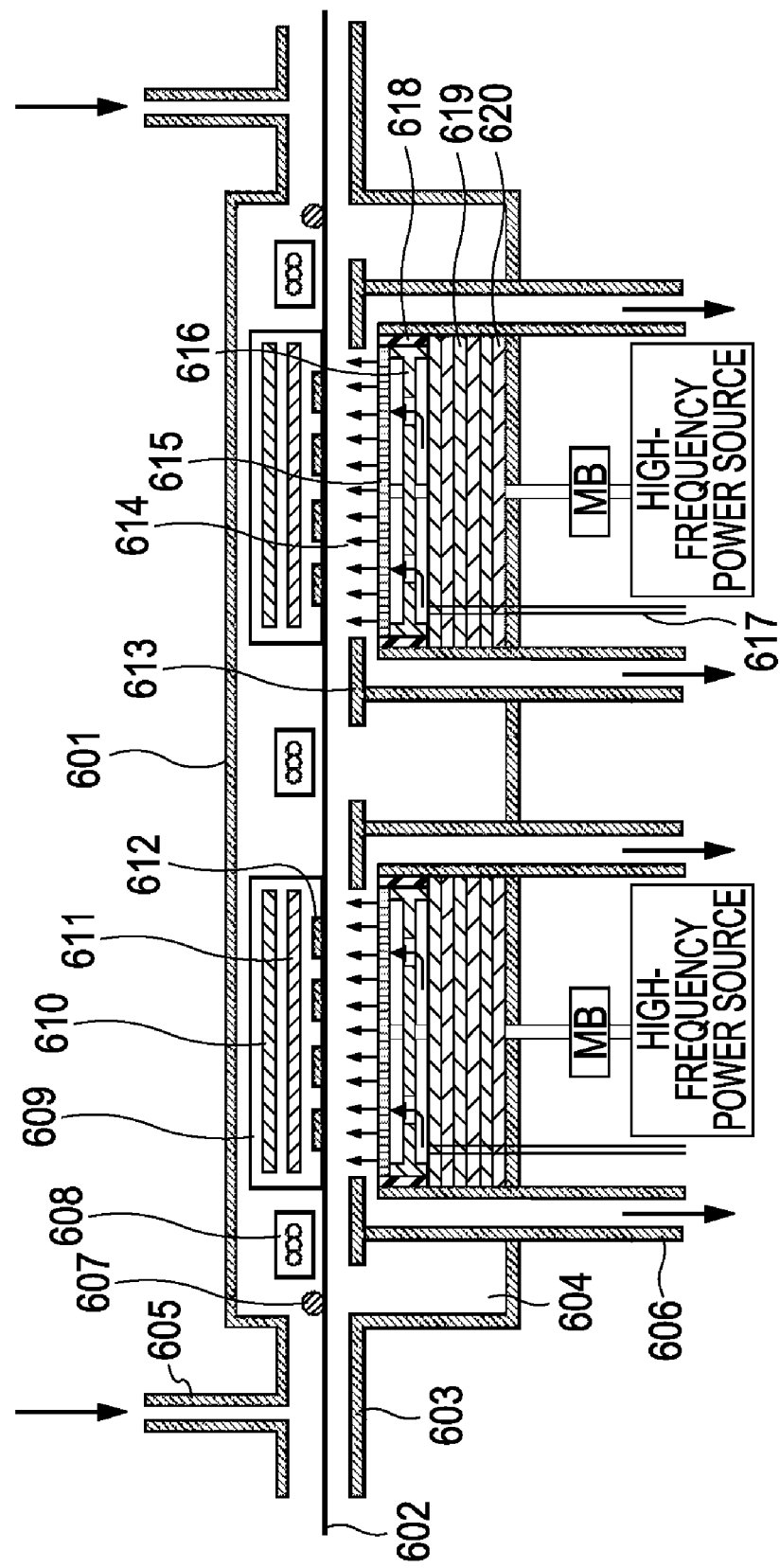
FIG. 6 is an enlarged view of a chamber for forming an i-type layer.

FIG. 6 is an enlarged view of an i-type-layer-forming chamber. FIG. 6 shows an i-type-layer-forming chamber 601, a substrate 602, gas gates 603, a first vacuum vessel 604, gate-gas supply ports 605, exhaust ports 606, mag rollers 607, lamp heaters 608, thermal control units 609, cooling units 610, heating units 611, magnets 612, opening-controlling plates 613, second vacuum vessels 614 (discharge space), shower cathodes 615, intermediate plates 616, source-gas supply ports 617, insulators 618, floating plates 619, and dielectric plates 620.

A method of the present invention for forming a deposited film will be described below with reference to FIGS. 5 and 6. Although FIGS. 5 and 6 show a roll-to-roll-type deposition-film-forming apparatus, the present invention is not limited to such a roll-to-roll type. Also for batch and single-wafer type deposition-film-forming apparatuses, the method of the present invention is effective for the apparatuses for deposited films on moving substrates.

With respect to a unit of the gas flow rate of each of a source gas, a diluent gas, and the like, the unit "sccm" or "slm" is used. The unit "sccm" means "1 cm$^3$/min (normal). The unit "slm" means "1,000 cm$^3$/min (normal).

A stainless-steel substrate provided with a reflecting sublayer and a reflection-enhancing sublayer formed with an apparatus (not shown) for forming the reflecting sublayer and the reflection-enhancing sublayer is unwound from the unwinding bobbin 503 in the unwinding chamber 504. The substrate is connected to the winding bobbin 505 in the winding chamber 506 through the gas gates 502, the n-type-layer-forming chamber 507, the i-type-layer-forming chamber 508, and the p-type-layer-forming chamber 509. The unwinding chamber 504, the winding chamber 506, and the chambers 507 to 509 are evacuated through exhaust ports (not shown) to achieve a pressure of, for example, $1 \times 10^{-4}$ Pa or less. A gate gas, such as hydrogen or helium, is allowed to flow from the gas gates 502. Desired source gases are allowed to flow into the film-forming chambers 507 to 509 from gas-supply ports (not shown) at desired flow rates. Simultaneously, in the film-forming chambers 507 to 509, the substrate is heated to desired temperatures with the pre-heaters 510 and the thermal control units 511. When the source gas flow rate, the substrate temperature, the pressure, and the like in each film-forming chamber reach predetermined values, high-frequency power is applied to the cathodes 512 from high-frequency power sources (not shown) to generate a plasma. Then the substrate is conveyed from the unwinding chamber 504 to the winding chamber 506 to sequentially form an n-type layer, an i-type layer, and a p-type layer on the substrate, thereby forming a pin structure.

A transparent electrode having a desired thickness is deposited on the p-type layer with an evaporator (not shown) for depositing a transparent electrode. Similarly, collecting electrodes are deposited on the transparent electrode.

The film formation in the film-forming chambers 507 to 509 will now be described in more detail with reference to FIG. 6 by means of the i-type-layer-forming chamber. The i-type-layer-forming chamber 601 is provided with the gas gates 603 communicating with both ends of the chamber. The gas gates 603 are provided with the gate-gas supply ports 605 so that a gate gas, such as hydrogen, helium, or an inert gas, is supplied from the gate-gas-supply ports. The gate gas has a function to inhibit the mixing of gases in adjacent film-forming chambers. The i-type-layer-forming chamber has a double structure in which the second vacuum vessels 614 that generate high-frequency plasmas are arranged in the first vacuum vessel 604. The shower cathodes 615 that serve as radio-frequency electrodes and gas-supply ports are arranged in the second vacuum vessels. The shower cathodes 615 are connected to high-frequency power sources via matching boxes. The space in the first vacuum vessel 604 is partially separated from the second vacuum vessels 614 with partitions that partition the space. The opening-controlling plates 613 are arranged on walls which constitute the second vacuum vessels 614 and which face the substrate 602 so as to control regions of the substrate that are brought into contact with the plasmas generated in the second vacuum vessels 614.

The substrate 602 in the i-type-layer-forming chamber 601 is supported by the mag rollers 607 and the thermal control units 609 arranged in the i-type-layer-forming chamber. The thermal control units 609 include the cooling units 610 and the heating units 611. The thermal control units 609 includes the magnets 612 arranged on the sides of the surfaces that are in contact with the substrate so that the thermal control units 609 and the substrate 602 are in thermal and electrical contact with each other. The thermal control units 609 control the temperature and potential of the substrate (to ground potential) while supporting the substrate. The shower cathodes 615 have many gas-releasing pores for dispersively feeding the gases on the cathode surfaces. The intermediate plates 616 including gas-feeding pores for uniformly dispersing the gases are arranged in the shower cathodes 615. The source gases fed from the source-gas supply ports 617 into the shower cathodes 615 are dispersed with the intermediate plates 616. Then the source gases are fed into the second vacuum vessels 614 (discharging space) through the gas-releasing pores arranged on the surfaces of the shower cathodes 615. Layered structures of the floating plates 619 composed of a metal material and the dielectric plates 620 are arranged between shower cathodes and the outer wall of the i-type-layer-forming chamber 601. The impedance of the shower cathodes 615 can be controlled by the structures. Furthermore, it is possible to inhibit the generation of an abnormal electrical discharge in a space between the shower cathodes 615 and the i-type-layer-forming chamber. As a result, high-frequency power is effectively transmitted to the shower cathodes 615. The side surfaces of the shower cathodes 615 are shielded by the insulators 618 and conductive walls surrounding the insulators. The gases fed into the i-type-layer-forming chamber 601 through the shower cathodes 615 and the gas gates 603 are exhausted from the exhaust ports 606.

In the above description, the apparatus has the single n-type-layer-forming chamber 507, the single i-type-layer-forming chamber 508, and the single p-type-layer-forming chamber 509. The number of each of the film-forming chambers may be changed as needed such that the apparatus has a structure capable of forming a layered photovoltaic element having a double or triple structure with a desired number of layers laminated. Furthermore, as needed, an n/i- or p/i-buffer-layer-forming chamber may be combined with the above-described chambers.

In the present invention, to observe the surface of the deposited film formed on the stationary substrate, the following method can be employed. That is, in FIG. 5, an observation window is formed at the gas gates 502 or the winding chamber 506. Observation is made by visual observation or with a detector such as a scanner or a CCD while the substrate is moved or in a stationary state.

Components constituting the photovoltaic element of the present invention will be described in detail below.

Substrate and Reflecting Sublayer

A metal substrate composed of, for example, stainless steel, in particular, ferrite stainless steel is suitable as the substrate used for the photovoltaic element of the present invention. A substrate composed of single-crystal silicon or polycrystalline silicon may be used as the substrate. Among insulating substrates, a substrate composed of glass or a ceramic material is suitable.

For the insulating substrate, it is necessary to subject the insulating substrate to conductive treatment, i.e., to deposit a metal or a transparent electroconductive film on the insulating substrate. In the case where a transparent electroconductive film is deposited on a light-transmitting substrate, such as a glass substrate, to form a photovoltaic element, light can be incident on the light-transmitting substrate side as well as the semiconductor side.

In the conductive treatment, a elemental metal, such as Al, Ag, or Cu, or an alloy thereof is deposited as the reflecting sublayer. The reflecting sublayer is required to have a thickness equal to or larger than the thickness such that the reflectivity of the elemental metal is obtained.

In the case where separate substrates composed of single-crystal silicon or polycrystalline silicon which are not in the form of a sheet are used, the substrates may be held by a holder capable of integrally holding the plurality of substrates and being conveyed.

To form the reflecting sublayer having a flatter surface, the reflecting sublayer can be formed at a relatively low temperature so as to have a thickness of several tens of nanometers to 300 nm. On the other hand, to form the reflecting sublayer having an irregular surface, the reflecting sublayer can be formed so as to have a thickness of more than 300 nm and several micrometers or less.

Reflection-Enhancing Sublayer

A reflection-enhancing sublayer for increasing the quantity of light absorbed in the semiconductor layers can be arranged on the metal substrate or the reflecting sublayer. The reflection-enhancing sublayer optimally has a thickness in the range of 100 nm to 5,000 nm.

The reflection-enhancing sublayer increases the diffused reflection of incident light and reflected light and has a role to extend the optical path length in the semiconductor layers. The reflection-enhancing sublayer also has a role to prevent the diffusion or migration of the elements of the reflecting sublayer into the semiconductor layers to form a shunt in the photovoltaic element. Furthermore, the reflection-enhancing sublayer has an appropriate resistance and thus has a role to prevent a short circuit caused by defects such as pinholes in the semiconductor layers. Moreover, the reflection-enhancing sublayer can have an irregular surface similar to the reflecting sublayer. The reflection-enhancing sublayer can be composed of an electroconductive oxide, such as indium oxide, tin oxide, zinc oxide, or indium tin oxide (ITO). The reflection-enhancing sublayer can be formed by, for example, evaporation, sputtering, CVD, electro-deposition, or a combination thereof. The electroconductive oxide may contain a material that changes conductivity. The reflection-enhancing sublayer can be formed at a low deposition rate in the region in contact with the reflecting sublayer. Furthermore, in the region in contact with the reflecting sublayer, the reflection-enhancing sublayer can be formed in an atmosphere containing oxygen.

In the case where the reflecting sublayer and the reflection-enhancing sublayer are formed by sputtering, the conditions, such as a method, the type and flow rate of a gas, internal pressure, input power, a deposition rate, and substrate temperature, significantly affect the sublayers. For example, in the case where a zinc oxide film is formed by DC magnetron sputtering with a zinc oxide target, examples of the gas include Ar, Ne, Kr, Xe, Hg, and $O_2$. The gas flow rate varies depending on the size of the apparatus and exhaust velocity. For example, at a capacity of the film-forming space of 20 L, the gas flow rate can be set in the range of 1 sccm to 100 sccm. The internal pressure during the film deposition can be set in the range of 10 mPa to 10 Pa. The input power varies depending on the size of the target. At a diameter of 15 cm, the input power can be set in the range of 10 W to 10 kW. The substrate temperature varies depending on the deposition rate. At a deposition rate of 1 µm/h, the substrate temperature can be set in the range of 70° C. to 450° C.

In the case of the formation of a zinc oxide film by electro-deposition, an aqueous solution containing nitrate ions and zinc ions is used in a corrosion-resistant vessel. The concentrations of nitrate ions and zinc ions can be set in the range of preferably 0.001 mol/L to 1.0 mol/L, more desirably 0.01 mol/L to 0.5 mol/L, and still more desirably 0.1 mol/L to 0.25 mol/L. Non-limiting examples of a source of nitrate ions and zinc ions include zinc nitrate serving as a source of both ions, and a mixture of an aqueous nitrate such as ammonium nitrate serving as a source of nitrate ions and a zinc salt such as zinc sulfate serving as a source of zinc ions. To inhibit abnormal growth and improve adhesion, the aqueous solution may contain a carbohydrate. Non-limiting examples of the carbohydrate that can be used include monosaccharides, such as glucose and fructose; disaccharides, such as maltose and saccharose; polysaccharides, such as dextrin and starch; and mixtures thereof.

To control the crystal grain size, the angle of inclination, and the like of the zinc oxide film, phthalic acid, isophthalic acid, maleic acid, naphthalic acid, or an ester thereof may be appropriately incorporated. The concentration of these polycarboxylic acids can be set in the range of preferably 0.5 µmol/L to 500 µmol/L, more desirably 50 µmol/L to 500 µmol/L, and still more desirably 150 µmol/L to 500 µmol/L. Controlling the concentrations of these polycarboxylic acids in the preferred range, described above results in the effective formation of a zinc oxide film having a textured structure which effectively exerts a light-trapping effect.

The content of the carbohydrate in the aqueous solution can be approximately set in the range of preferably 0.001 g/L to 300 g/L, more desirably 0.005 g/L to 100 g/L, and still more desirably 0.01 g/L to 60 g/L, depending on the type of carbohydrate. In the case of the formation of the zinc oxide film by electro-deposition in an aqueous solution, a base on which the zinc oxide film is deposited can be allowed to function as a negative electrode, and zinc, platinum, carbon, or the like can be allowed to function as a positive electrode. In this case, a current flowing through a load resistance can have an electric current density of 10 mA/dm to 10 A/dm.

P-Type Layer and N-Type Layer

The p-type layer or n-type layer is an important feature for setting the characteristics of the photovoltaic element. Examples of the amorphous, microcrystalline, and polycrystalline materials for the p-type layer or the n-type layer include a-Si:H, a-Si:HX, a-SiC:H, a-SiC:HX, a-SiGe:H, a-SiGeC:H, a-SiO:H, a-SiN:H, a-SiON:HX, a-SiOCN:HX, µc-Si:H, µc-SiC:H, µc-Si:HX, µc-SiC:HX, µc-SiGe:H, µc-SiO:H, µc-SiGeC:H, µc-SiN:H, µc-SiON:HX, µc-SiOCN:HX, poly-Si:H, poly-Si:HX, poly-SiC:H, poly-SiC:HX, poly-SiGe:H, poly-Si, poly-SiC, and poly-SiGe. These materials can be appropriately doped with p-type valence control agents (the Group III elements, such as B, Al, Ga, In, and Tl) or n-type valence control agents (the Group V elements, such as P, As, Sb, and Bi).

In particular, a crystalline semiconductor layer having low optical absorption or an amorphous semiconductor layer having a wide band gap is suitable for the p- or n-type layer located on the incident light side.

The optimum content of the Group III elements in the p-type layer and the optimum content of the Group V elements in the n-type layer are each in the range of 0.1 to 50 atomic percent (at %).

Hydrogen and/or deuterium atoms (H and D) and halogen atoms in the p- or n-type layer compensate for dangling bonds in the p- or n-type layer and improve the efficiency of doping in the p- or n-type layer. The optimum content of hydrogen atoms or halogen atoms in the p- or n-type layer is in the range of 0.1 to 40 at %. For the crystalline p- or n-type layer, in particular, the optimum content of hydrogen atoms or halogen atoms is in the range of 0.1 to 8 at %.

A higher concentration of hydrogen atoms and/or halogen atoms can be present in the vicinity of the interfaces between the p-type layer and the i-type layer and between the n-type layer and the i-type layer. The concentration of hydrogen atoms and/or halogen atoms in the vicinity of the interfaces can be set in the range of 1.1 to 2 times the concentration thereof in another portion. A higher concentration of hydrogen atoms and/or halogen atoms in the vicinity of the interfaces between the p-type layer and the i-type layer and between the n-type layer and the i-type layer reduces the defect level and mechanical strain in the vicinity of the interfaces and increases the photovoltage and photocurrent of the layered photovoltaic element of the present invention.

With respect to the electrical properties of the p- and n-type layers of the photovoltaic element, each of the p- and n-type layers can have an activation energy of 0.2 eV or less and, optimally, 0.1 eV or less. Each of the p- and n-type layers can have a resistivity of 100 Ω·cm or less and, optimally, 1 Ω·cm or less. Each of the p- and n-type layers can have a thickness in the range of 1 to 50 nm and, optimally, 3 to 10 nm.

Examples of the source gas suitable for the deposition of the p- or n-type layer of the photovoltaic element include vaporizable compounds containing silicon atoms, vaporizable compounds containing germanium atoms, vaporizable compounds containing carbon atoms, and mixture gases thereof.

Examples of the vaporizable compounds containing silicon atoms include $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, and $Si_2D_3H_3$.

Examples of the vaporizable compounds containing germanium atoms include $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$.

Examples of the vaporizable compounds containing carbon atoms include $CH_4$, $CD_4$, $C_nH_{2n+2}$ (n represents an integer), $C_nH_{2n}$ (n represents an integer), $C_2H_2$, $C_6H_6$, $CO_2$, and $CO$.

Examples of a nitrogen-containing gas include $N_2$, $NH_3$, $ND_3$, $NO$, $NO_2$, and $N_2O$.

Examples of an oxygen-containing gas include $O_2$, $CO$, $CO_2$, $NO$, $NO_2$, $N_2O$, $CH_3CH_2OH$, and $CH_3OH$.

The Group III elements and the Group V elements may be incorporated into the p- or n-type layer to control the valence state.

Examples of starting materials that can be effectively used for introducing the Group III elements include boron hydrides, such as $B_2H_6$, $B_4H_{10}$, $B_5H_9$, $B_5H_{11}$, $B_6H_{10}$, $B_6H_{12}$, and $B_6H_{14}$, and boron halides, such as $BF_3$ and $BCl_3$, for introducing boron atoms; and other compounds, such as $AlCl_3$, $GaCl_3$, $InCl_3$, and $TlCl_3$. In particular, $B_2H_6$ and $BF_3$ are suitable.

Examples of starting materials for introducing the Group V elements include phosphorus hydrides, such as $PH_3$ and $P_2H_4$, and phosphorus halides, such as $PH_4I$, $PF_3$, $PF_5$, $PCl_3$, $PCl_5$, $PBr_3$, $PBr_5$, and $PI_3$, for introducing phosphorus atoms; and other compounds, such as $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$. In particular, $PH_3$ and $PF_3$ are suitable.

Examples of a method for forming the p- or n-type layer suitable for the photovoltaic element include RF plasma-enhanced CVD, VHF plasma-enhanced CVD, and microwave plasma-enhanced CVD. In particular, in the case of the deposition by RF plasma-enhanced CVD or VHF plasma-enhanced CVD, capacitively-coupled plasma CVD is suitable. In the case of the formation of the p- or n-type layer by RF plasma-enhanced CVD or VHF plasma-enhanced CVD, the substrate temperature in a deposition chamber can be set in the range of 100° C. to 350° C., and the internal pressure can be set in the range of 10 Pa to 2,000 Pa. The RF or VHF power can be optimally set in the range of 0.01 $W/cm^2$ to 5.0 $W/cm^2$. The deposition rate can be optimally set in the range of 0.1 nm/s to 10 nm/s.

Each of the above-described vaporizable compounds may be appropriately diluted with a gas, such as $H_2$, He, Ne, Ar, Xe, or Kr, and then may be fed into the deposition chamber.

In particular, in the case of the formation of a film having low optical absorption or a wide band gap, e.g., a microcrystalline semiconductor film or an a-SiC:H film, the source gas can be diluted 2 to 100 times with hydrogen gas. A relatively high input RF or VHF power can be applied. In the present invention, in the case of RF plasma-enhanced CVD, the deposition can be performed at a frequency of 1 MHz to 30 MHz and, optimally, about 13.56 MHz. In the case of RF plasma-enhanced CVD, the deposition can be performed at a frequency of 30 MHz to 500 MHz, desirably 40 MHz to 450 MHz, and, optimally, 50 MHz to 400 MHz.

In the case where the p- or n-type layer is formed by microwave plasma-enhanced CVD, a microwave plasma-enhanced CVD apparatus suitably has a structure in which a microwave is introduced into a deposition chamber with a waveguide via a dielectric window (e.g., alumina ceramic material). The method of the present invention for forming a deposited film is also suitable. In the case where the p- or n-type layer is formed by microwave plasma-enhanced CVD, the deposited film applicable to the photovoltaic element can be formed under broader deposition conditions.

In the case where the p- or n-type layer is formed by microwave plasma-enhanced CVD, the substrate temperature in the deposition chamber can be set in the range of 100° C. to 400° C., and the internal pressure can be set in the range of 0.05 Pa to 300 Pa. The microwave power can be set in the range of 0.01 $W/cm^3$ to 1 $W/cm^3$. Microwaves having a frequency of 0.5 GHz to 10 GHz can be used.

Each of the above-described vaporizable compounds may be appropriately diluted with a gas, such as $H_2$, He, Ne, Ar, Xe, or Kr, and then may be fed into the deposition chamber.

In the case of the formation of a film having low optical absorption or a wide band gap, e.g., a microcrystalline semiconductor film or an a-SiC:H film, the source gas can be diluted 2 to 100 times with a hydrogen gas. A relatively high input microwave power can be applied.

Microcrystalline i-Type Layer

Examples of methods suitable for the deposition of microcrystalline silicon of the photovoltaic element of the present invention include RF plasma-enhanced CVD, VHF plasma-enhanced CVD, and microwave plasma-enhanced CVD. In particular, the deposition rate of microcrystalline silicon depends on electromagnetic waves used. At constant input energy, higher frequencies result in higher deposition rates.

Examples of a source gas for supplying silicon atoms suitable for microcrystalline silicon of the present invention include silane gases, such as $SiH_4$, $Si_2H_6$, $SiF_4$, $SiHF_3$, $SiH_2F_2$, $SiH_3F$, $SiH_3Cl$, $SiH_2Cl_2$, $SiHCl_3$, $SiCl_4$, $SiD_4$, $SiHD_3$, $SiH_2D_2$, $SiH_3D$, $SiFD_3$, $SiF_2D_2$, $SiD_3H$, and $Si_2D_3H_3$.

Examples of a source gas for supplying germanium atoms suitable for microcrystalline silicon-germanium include $GeH_4$, $GeF_4$, $GeHF_3$, $GeH_2F_2$, $GeH_3F$, $GeHCl_3$, $GeH_2Cl_2$, $GeH_3Cl$, $GeHD_3$, $GeH_2D_2$, $GeH_3D$, $Ge_2H_6$, and $Ge_2D_6$.

The source gas needs to be diluted with a hydrogen gas in order to form a satisfactory microcrystalline semiconductor. The dilution ratio can be set at 10 times or more and desirably 10 to 100 times. At a low dilution ratio, a microcrystalline semiconductor is not formed; instead an amorphous semiconductor is formed. An excessively high dilution ratio results in an excessively low deposition rate of the microcrystalline semiconductor, which is a practical problem. The source gas may also be diluted with a helium gas as well as hydrogen gas.

The substrate temperature for forming the microcrystalline semiconductor suitable for the present invention is in the range of 100° C. to 500° C. In particular, at a high deposition rate, the substrate temperature can be set at a relatively high temperature.

In the case where the microcrystalline semiconductor is formed by VHF plasma-enhanced CVD, the pressure in the chamber can be set in the range of 100 Pa to 2,000 Pa during the formation of the microcrystalline semiconductor of the present invention. Alternatively, in the case where the microcrystalline semiconductor is formed by microwave plasma-enhanced CVD, the pressure can be set in the range of 0.05 Pa to 300 Pa.

In the present invention, the input power to the chamber during the formation of the microcrystalline semiconductor can be set in the range of 0.01 $W/cm^2$ to 10 $W/cm^2$. With respect to the relationship between the source gas flow rate and the input power, where importance is attached to the characteristics of the deposited film, a power limited region where the deposition rate depends on the input power is suitable. Where importance is attached to gas utilization efficiency, a flow limited region where the deposition rate depends on the flow rate of the introduced gas is suitable.

To further improve the characteristics of the microcrystalline semiconductor, an electric field (bias electric field) can be controlled such that the substrate is bombarded with excessive cations. For example, a negative direct electric field with respect to ground potential is superimposed on the radio-frequency electrode to capture cations present in the plasma space by the radio-frequency electrode, thereby controlling the number of cations with which the substrate is bombarded.

In the deposition of the microcrystalline semiconductor according to the present invention, the distance between the substrate and the electrode for power input is an important factor. The interelectrode distance at which a microcrystalline semiconductor suitable for the present invention is obtained is within the range of 2 mm to 50 mm.

The average crystal grain diameter suitable for the microcrystalline semiconductor of the layered photovoltaic element of the present invention can be set in the range of 10 nm to 300 nm.

An average crystal grain diameter of less than 10 nm increases the amount of the amorphous semiconductor present at the grain boundaries, thereby exhibiting light degradation. Furthermore, a small crystal grain diameter reduces the mobility and lifetime of electrons and holes, thereby degrading the characteristics as a semiconductor.

An average crystal grain diameter exceeding 300 nm results in insufficient relaxation of the crystal boundaries, thereby forming defects such as dangling bonds at the grain boundaries. These defects function as recombination centers of electrons and holes to degrade the characteristics of the microcrystalline semiconductor.

The microcrystalline semiconductor can have an elongated shape along the direction of movement of electric charge. The content of the hydrogen atoms or the halogen atoms in the microcrystalline semiconductor can be set at 30% or less.

In a photovoltaic element, an i-type layer is an important layer that generates carriers in response to irradiated light and transports them. As the i-type layer, a slightly p-type layer or a slightly n-type layer may be used (whether the layer is of p-type or n-type depends on the distribution of intrinsic defects such as tail state).

As the i-type layer of the photovoltaic element of the present invention, a layer composed of a semiconductor having a uniform band gap is suitable. Furthermore, a layer containing silicon atoms and germanium atoms with the band gap being gradually changed in the thickness direction of the i-type layer and with a minimum value of the band gap being offset toward the interface between a p-type layer and the i-type layer with respect to the center of the i-type layer is suitable. An i-type layer doped with a valence control agent that will serve as a donor and a valence control agent that will serve as an acceptor is also suitable.

In particular, a higher concentration of hydrogen atoms and/or halogen atoms can be present in the vicinity of the interfaces between the p-type layer and the i-type layer and between the n-type layer and the i-type layer. The concentration of hydrogen atoms and/or halogen atoms in the vicinity of the interfaces can be set in the range of 1.1 to 2 times the concentration thereof in another portion. The concentration of hydrogen atoms and/or halogen atoms can be changed in response to the concentration of silicon atoms. The concentration of hydrogen atoms and/or halogen atoms in a region where the concentration of silicon atoms is the least can be set in the range of 1 at % to 10 at %, and can be in the range of 0.3 to 0.8 times the concentration thereof in a region where the concentration of hydrogen atoms and/or halogen atoms is the greatest.

The concentration of hydrogen atoms and/or halogen atoms is changed in response to the concentration of silicon atoms, i.e., in response to the band gap. Specifically, the concentration of hydrogen atoms and/or halogen atoms is low in a narrow band gap region.

The thickness of the i-type layer greatly depends on the structure (e.g., a single cell structure, a tandem cell structure or a triple cell structure) of the photovoltaic element, and on the band gap of the i-type layer. The thickness of the i-type layer can be optimally set in the range of 0.7 to 30.0 µm.

The band gap of the i-type layer can be designed to be larger on the side of the p-type layer/i-type layer interface and on the side of the n-type layer/i-type layer interface. Such design results in an increase in the photovoltage and photocurrent of the photovoltaic element. Furthermore, such design results in the prevention of light degradation and the like due to long-term service.

Amorphous i-Type Layer

In the present invention, a layered photovoltaic element including a unit segment having a pin junction with an i-type layer containing microcrystalline silicon and a unit segment having a pin junction with an i-type layer containing amorphous silicon can be formed, as needed. In this case, examples of methods suitable for the deposition of amorphous silicon include RF plasma-enhanced CVD, VHF plasma-enhanced CVD, and microwave plasma-enhanced CVD. In particular, the deposition rate of the amorphous silicon depends on electromagnetic waves used. At constant input energy, higher frequencies result in higher deposition rates.

Examples of a source gas for supplying silicon atoms suitable for amorphous silicon of the present invention include silane gases, such as $SiH_4$, $Si_2H_6$, $SiF_4$, $SiHF_3$, $SiH_2F_2$, $SiH_3F$, $SiH_3Cl$, $SiH_2Cl_2$, $SiHCl_3$, $SiCl_4$, $SiD_4$, $SiHD_3$, $SiH_2D_2$, $SiH_3D$, $SiFD_3$, $SiF_2D_2$, $SiD_3H$, and $Si_2D_3H_3$.

Examples of a source gas for supplying germanium atoms suitable for amorphous germanium include $GeH_4$, $GeF_4$, $GeHF_3$, $GeH_2F_2$, $GeH_3F$, $GeHCl_3$, $GeH_2Cl_2$, $GeH_3Cl$, $GeHD_3$, $GeH_2D_2$, $GeH_3D$, $Ge_2H_6$, and $Ge_2D_6$.

The source gas needs to be diluted with a hydrogen gas in order to form a satisfactory microcrystalline semiconductor. The dilution ratio can be set at 5 times or more and desirably 5 to 10 times. The source gas may also be diluted with a helium gas as well as with hydrogen gas.

The substrate temperature for forming the amorphous semiconductor suitable for the present invention is in the range of 100° C. to 500° C. In particular, at a high deposition rate, the substrate temperature can be set at a relatively high temperature.

The pressure in the chamber can be set in the range of 0.05 Pa to 500 Pa during the formation of the amorphous semiconductor of the present invention. In the case where the microcrystalline semiconductor is formed by VHF plasma-enhanced CVD, in particular, the pressure can be set in the range of 50 Pa to 300 Pa. Alternatively, in the case where the amorphous semiconductor is formed by microwave plasma-enhanced CVD, the pressure can be set in the range of 0.1 Pa to 10 Pa.

In the present invention, the input power to the chamber during the formation of the amorphous semiconductor can be set in the range of 0.01 W/cm$^2$ to 5 W/cm$^2$. With respect to the relationship between the source gas flow rate and the input power, a power limited region where the deposition rate depends on the input power is suitable. In the case where importance is attached to gas utilization efficiency, a flow limited region where the deposition rate depends on the flow rate of the introduced gas is suitable.

When the amorphous semiconductor is deposited at a higher deposition rate, a direct electric field (bias electric field) can be controlled such that the substrate is bombarded with ions.

The content of the hydrogen atoms or the halogen atoms in the amorphous semiconductor according to the present invention can be set in the range of 5% to 30%.

In a photovoltaic element, an i-type layer is an important layer that generates carriers in response to irradiated light and transports them. As the i-type layer, a slightly p-type layer or a slightly n-type layer may be used (whether the layer is of p-type or n-type depends on the distribution of intrinsic defects such as tail state).

As the i-type layer of the layered photovoltaic element of the present invention, a layer composed of a semiconductor having a uniform band gap is suitable. Furthermore, a layer containing silicon atoms and germanium atoms with the band gap being gradually changed in the thickness direction of the i-type layer and with a minimum value of the band gap being offset toward the interface between a p-type layer and the i-type layer with respect to the center of the i-type layer is suitable. An i-type layer doped with a valence control agent that will serve as a donor and a valence control agent that will serve as an acceptor is also suitable.

In particular, a higher concentration of hydrogen atoms and/or halogen atoms can be present in the vicinity of the interfaces between the p-type layer and the i-type layer and between the n-type layer and the i-type layer. The concentration of hydrogen atoms and/or halogen atoms in the vicinity of the interfaces can be set in the range of 1.1 to 2 times the concentration thereof in another portion. The concentration of hydrogen atoms and/or halogen atoms can be changed in response to the concentration of silicon atoms. The concentration of hydrogen atoms and/or halogen atoms in a region where the concentration of silicon atoms is the least can be set in the range of 1 at % to 10 at %, and can be in the range of 0.3 to 0.8 times the concentration thereof in a region where the concentration of hydrogen atoms and/or halogen atoms is the greatest. When both hydrogen atoms and halogen atoms are contained, the content of halogen atoms can be set at 1/10 or less of the content of hydrogen atoms.

The concentration of hydrogen atoms and/or halogen atoms is changed in response to the concentration of silicon atoms, i.e., in response to the band gap. Specifically, the concentration of hydrogen atoms and/or halogen atoms is low in a narrow band gap region.

The thickness of the i-type layer greatly depends on the structure (e.g., a single cell structure, a tandem cell structure or a triple cell structure) of the photovoltaic element, and on the band gap of the i-type layer. The thickness of the i-type layer can be optimally set in the range of 0.05 μm to 10 μm.

The band gap of the i-type layer can be designed to be larger on the side of the p-type layer/i-type layer interface and on the side of the n-type layer/i-type layer interface. Such design results in an increase in the photovoltage and photocurrent of the photovoltaic element. Furthermore, such design results in the prevention of light degradation and the like due to long-term service.

Transparent Electrode

As the transparent electrode, a transparent electrode composed of, for example, indium oxide or indium tin oxide is suitable.

Optimal examples of a method for depositing the transparent electrode include sputtering and vacuum evaporation. In the case where a transparent electrode composed of indium oxide is formed on a substrate with a DC magnetron sputtering apparatus, examples of the material of a target include metallic indium (In) and indium oxide ($In_2O_3$).

In the case where a transparent electrode composed of indium tin oxide is formed on a substrate, examples of the material of a target include appropriate combinations of metallic tin, metallic indium, an alloy of metallic tin and metallic indium, tin oxide, indium oxide, and indium tin oxide.

When the deposition is performed by sputtering, the substrate temperature is an important factor. The substrate temperature can be set in the range of 25° C. to 600° C. Examples of a gas used for sputtering include inert gases, such as an argon gas (Ar), a neon gas (Ne), a xenon gas (Xe), and a helium gas (He). In particular, an Ar gas can be optimally used. The above described inert gas may contain an oxygen gas ($O_2$), if necessary. In particular, when the target is composed of a metal, the incorporation of an oxygen gas ($O_2$) is essential.

To effectively perform sputtering with the above-described inert gas, the pressure in an discharge space can be set in the range of 0.05 Pa to 10 Pa. As the power supply for sputtering, a DC power supply or an RF power supply can be suitably used. The electric power during sputtering can be suitably set in the range of 10 W to 1,000 W.

The deposition rate of the transparent electrode depends on the pressure in the discharge space and the discharge power. The deposition rate can be optimally set in the range of 0.01 to 10 nm/s.

The transparent electrode can be formed so as to have a thickness such that satisfies the requirements for an antireflective film. Specifically, the thickness can be set in the range of 50 nm to 300 nm.

Examples of an evaporation source suitable for the deposition of the transparent electrode by evaporation include metallic tin, metallic indium, and indium-tin alloys.

The substrate temperature can be set in the range of 25° C. to 600° C. during the deposition of the transparent electrode.

Furthermore, when the transparent electrode is deposited, it is necessary to reduce the pressure in the deposition chamber to $10^{-4}$ Pa or less and then to introduce an oxygen gas ($O_2$) at a pressure in the range of $5 \times 10^{-3}$ Pa to $9 \times 10^{-2}$ Pa. The introduction of the oxygen gas at this pressure range allows a metal vaporized from the evaporation source to react with oxygen in the gas phase, thereby forming a satisfactory transparent electrode.

RF electric power may be applied to the chamber at the above-described pressure to generate a plasma, and evaporation may be performed utilizing the plasma.

The deposition rate of the transparent electrode under the above-described conditions can be set in the range of 0.01 nm/s to 10 nm/s. A deposition rate of less than 0.01 nm/s reduces productivity. A deposition rate exceeding 10 nm/s results in a coarse film, thereby reducing the transmittance, conductivity, adhesion, and the like thereof.

Collecting Electrode

In the case where the transparent electrode 114 has insufficiently low resistivity, according to need, the collecting electrode 115 is formed on part of the transparent electrode 114 to reduce the resistivity of the electrode and the series resistance of the photovoltaic element.

Examples of the material of the collecting electrode include metals, such as gold, silver, copper, aluminum, nickel, iron, chromium, molybdenum, tungsten, titanium, cobalt, tantalum, niobium, and zirconium; alloys such as stainless steel; and conductive pastes containing powdered metal. The collecting electrode is preferably formed in a comb shape so as not to shield light incident on the semiconductor layer as far as possible.

The ratio of the area occupied by the collecting electrode to the area of the whole photovoltaic device can be desirably set at 15% or less, more desirably 10% or less, and optimally 5% or less.

The collecting electrode is patterned with a mask. Examples of a method for forming the collecting electrode include evaporation, sputtering, plating, and printing.

When a photovoltaic device which outputs desired voltage and current using the layered photovoltaic element of the present invention is manufactured, the photovoltaic elements of the present invention are connected in series or in parallel. Protective layers are formed on the front surface and the rear surface, respectively. Electrodes for extracting an output and the like are attached. When the photovoltaic elements of the present invention are connected in series, a back flow preventing diode may be incorporated as needed.

EMBODIMENTS

The present invention will be described in more detail below by means of non-limiting embodiments.

First Embodiment

In this embodiment, according to a procedure described below, a deposited film is continuously formed for 50 hours with the roll-to-roll apparatus illustrated in FIG. 5 while a substrate is conveyed (moved). A film is formed on the stationary substrate every 5 hours. The relationship between the change of the surface state and the characteristics of the deposited film is investigated.

A strip base (having a width of 40 cm, an effective length of 1.000 m, and a thickness of 0.125 mm) composed of stainless steel (SUS430BA) is sufficiently degreased and cleaned. The base is mounted to a continuous sputtering apparatus (not shown). A Ag thin film having a thickness of 100 nm is formed by sputtering with a Ag electrode as a target. A ZnO thin film having a thickness of 1.2 μm is formed on the Ag thin film by sputtering with a ZnO target to form a strip conductive substrate 501.

In this embodiment, the substrate is allowed to remain stationary for 5 minutes before the initiation of the formation of a deposited film, and the deposited-film formation (hereinafter, referred to as "stationary film formation") is performed in the i-type-layer-forming chamber under the conditions shown in Table 1. Then the stationary film formation is performed every 5 hours, the deposited film is formed for 50 hours. The conveyance velocity of the substrate is 300 mm/min.

After the completion of the deposition-film-forming step, the substrate is removed from the winding chamber. Stationary film formation portions are cut out. The surfaces are visually observed. The intensities of Raman scattering of regions having different colors are measured. Comparisons are made to determine the ratio of the area of a region composed of microcrystalline silicon to the total area.

With respect to the formation of the deposited film other than the stationary film formation portions, an n-, i-, and p-type semiconductor layers are formed in sequence from the substrate side according to the above-described procedure under the conditions shown in Table 1 with the apparatus shown in FIG. 5. A sputtering apparatus and an evaporation apparatus (not shown) are used. A transparent conductive ITO film having a thickness of 80 nm is formed as a front surface electrode 114 on the n-i-p photoelectric conversion unit by sputtering. A comb-shaped Ag electrode 115 for current extraction is formed thereon by evaporation to form samples of a solar cell (single cell) having a pin structure shown in FIG. 3.

The thickness of the n-type layer is 20 nm. The thickness of an n/i buffer layer is 10 nm. The thickness of a p/i buffer layer is 10 nm. The thickness of the p-type layer is 5 nm. The thickness of the i-type layer is 1,500 nm.

In this embodiment, with respect to the solar cell samples, a portion apart from each stationary film formation portion by the total length of the deposition-film-forming chambers is defined as a sample of the photovoltaic element for the reasons described below.

When the stationary film formation is performed, deposited films are formed for 5 minutes on portions of the substrate that resides in the deposition-film-forming chambers. Thus, although the conveyance of the substrate is initiated to resume the usual formation of the deposited film, a design pin structure is not formed. Therefore, deposited films formed at positions 10 cm apart from ends of the portions of the substrate that resides in the deposition-film-forming chambers during the stationary film formation are defined as solar cell samples according to the above-described procedure.

In Table 1, the term "RF" as high-frequency power refers to RF electric power having a frequency of 13.56 MHz. The term "VHF" refers to VHF electric power having a frequency of 60 MHz. With respect to a bias voltage, a predetermined, negative direct electric field with respect to ground potential is superimposed on the radio frequency electrode.

TABLE 1

|  | n-Type layer | n/i Buffer layer | i-Type layer | p/i Buffer layer | p-Type layer |
|---|---|---|---|---|---|
| Gas species and flow rate |  |  |  |  |  |
| $SiH_4$ (sccm) | 30 | 15 | 700 | 50 | 50 |
| $SiF_4$ (sccm) |  |  | 600 |  |  |
| $H_2$ (slm) | 3.6 | 4 | 10 | 0.4 | 15 |
| $PH_3$ (%) | 5 |  |  |  |  |
| $BF_3$ (%) |  |  |  |  | 30 |
| Bias voltage (V) | 0 | 0 | −80 | 0 | 0 |
| Substrate temperature (° C.) | 220 | 250 | 200 | 220 | 150 |
| Pressure (Pa) | 1000 | 1000 | 1000 | 1000 | 1000 |
| High frequency power (kW) | 0.2 (RF) | 1.2 (VHF) | 6 (VHF) | 0.2 (RF) | 1.5 (RF) |
| Interelectrode distance (mm) | 10 | 15 | 6 | 15 | 10 |
| Film thickness (nm) | 30 | 10 | 2000 | 10 | 10 |

Photoelectric conversion efficiency, short-circuit current (Jsc), open circuit voltage (Voc), and fill factor (FF) of each of the resulting samples are measured with a solar simulator (AM 1.5; 100 mW/cm$^2$). The respective samples are irradiated with light with a spectrum of AM 1.5 and a light intensity of 1 sun for 1,000 hours while being maintained at 50° C. The characteristics of the samples after the light irradiation are measured similarly to those before the light irradiation, and the light degradation ratio is determined.

Table 2 shows the results.

In Table 2, the term "area ratio" refers to the ratio of the area of the region composed of microcrystalline silicon to the total area. The symbols in Table 2 represent as follows.

Jsc (Short-circuit Current)
Excellent: 25 mA/cm$^2$ or more
Good: 20 mA/cm$^2$ or more and less than 25 mA/cm$^2$ Fair: 15 mA/cm² or more and less than 20 mA/cm²
Poor: less than 15 mA/cm² or unmeasurable Voc (Open Circuit Voltage)
Excellent: 0.5 V or more
Good: 0.4 V or more and less than 0.5 V
Fair: 0.3 V or more and less than 0.4 V
Poor: less than 0.3 V or unmeasurable FF (Fill Factor)
Excellent: 0.5 or more
Good: 0.4 or more and less than 0.5
Fair: 0.3 or more and less than 0.4
Poor: less than 0.3 or unmeasurable η (Photoelectric Conversion Efficiency)
Excellent: 7% or more
Good: 6% or more and less than 7%
Fair: 5% or more and less than 7%
Poor: less than 5%

Light Degradation Ratio
Excellent: less than 7%
Good: 7% or more and less than 12%
Fair: 12% or more and less than 17%
Poor: 17% or more microcrystalline silicon by visual observation, the intensity of Raman scattering attributed to a crystalline component is equal to or higher than 5 times the intensity of Raman scattering attributed to an amorphous component. In the region determined to be amorphous silicon by visual observation, the intensity of Raman scattering attributed to the crystalline component is equal to or less than the intensity of Raman scattering attributed to the amorphous component. This demonstrates that the determination based on visual observation corresponds to the intensity.

The above-described results demonstrate that the ratio of the area of microcrystalline silicon to the total area can be desirably set at 50% or more, more desirably 70% or more, and optimally 80% or more. Furthermore, the results demonstrate that the determination based on visual observation is effective.

Second Embodiment

In this embodiment, a deposited film is continuously formed for 50 hours under the conditions shown in Table 3 with the roll-to-roll apparatus illustrated in FIG. 5 while a substrate is conveyed (moved) as in the first embodiment.

TABLE 2

| | Film forming time (hr) | | | | | | | | | | |
|---|---|---|---|---|---|---|---|---|---|---|---|
| | 0 | 5 | 10 | 15 | 20 | 25 | 30 | 35 | 40 | 45 | 50 |
| Area ratio (%) | 100 | 95 | 90 | 85 | 80 | 75 | 70 | 60 | 50 | 45 | 40 |
| Raman intensity ratio (region composed of microcrystalline silicon) | >5 | >5 | >5 | >5 | >5 | >5 | >5 | >5 | >5 | >5 | >5 |
| Raman intensity ratio (region composed of amorphous silicon) | <1 | <1 | <1 | <1 | <1 | <1 | <1 | <1 | <1 | <1 | <1 |
| Voc | Excellent | Excellent | Excellent | Excellent | Excellent | Excellent | Excellent | Excellent | Excellent | Excellent | Excellent |
| Jsc | Excellent | Excellent | Excellent | Excellent | Excellent | Good | Good | Good | Good | Fair | Poor |
| FF | Excellent | Excellent | Excellent | Excellent | Excellent | Excellent | Good | Good | Good | Fair | Fair |
| Conversion efficiency | Excellent | Excellent | Excellent | Excellent | Excellent | Excellent | Excellent | Good | Good | Fair | Fair |
| Light degradation ratio | Excellent | Excellent | Excellent | Excellent | Excellent | Good | Good | Good | Good | Fair | Poor |

Table 2 clearly shows that the ratio of the area of the region composed of microcrystalline silicon to the total area is reduced with deposition-film-forming time and that the characteristics of the photovoltaic element are also reduced. In particular, when the ratio of the area of the region composed of microcrystalline silicon to the total area is less than 50%, the characteristics are close to those of amorphous silicon rather than those of microcrystalline silicon. The open-circuit voltage characteristics tend to be higher than that of the microcrystalline silicon. Other characteristics tend to be reduced. In particular, the short-circuit current is reduced, thereby increasing the light degradation ratio.

Comparison between the discrimination of different color regions by visual observation and the intensities of Raman scattering in the regions demonstrates the effectiveness of visual observation. That is, in the region determined to be The stationary film formation is performed in the i-type-layer-forming chamber every 5 hours after the initiation of the formation of the deposited film.

The surfaces of the stationary film formation portions are visually observed from an observation window (not shown) provided on the winding chamber 506 when the substrate is wound up to the winding bobbin 505 in the winding chamber 506. The bias voltage is controlled in the range of −80 V to −200 V so as not to reduce the ratio of the area of the region composed of microcrystalline silicon to the total area. The flow rate of a dilution hydrogen gas is controlled in the range of 10 slm to 20 slm. A preliminary experiment has been performed to determine the relationship between the ratio of the area of the region composed of microcrystalline silicon to the total area and the bias voltage and between the ratio and the flow rate of the dilution hydrogen gas. The bias voltage and between the ratio and the flow rate of the dilution hydrogen gas are controlled on the basis of the correlation.

Samples of a solar cell (single cell) having the pin structure shown in FIG. 3 are formed as in the first embodiment except for the stationary film formation portions. The samples are evaluated as in the first embodiment.

Table 4 shows the results.

The deposited film is continuously formed under the conditions shown in FIG. 5, except that the steps of replacing Substrates 1 to 5. In this case, the conveyance velocity of the substrate is 300 mm/min. A step of interrupting plasma-enhanced CVD for 60 minutes (second step of forming a deposited film) is performed during the step of replacing the substrate. In this way, the deposited film is intermittently formed.

TABLE 3

|  | n-Type layer | n/i Buffer layer | i-Type layer | p/i Buffer layer | p-Type layer |
|---|---|---|---|---|---|
| Gas species and flow rate |  |  |  |  |  |
| $SiH_4$ (sccm) | 30 | 15 | 700 | 50 | 50 |
| $SiF_4$ (sccm) |  |  | 600 |  |  |
| $H_2$ (slm) | 3.6 | 4 | 10 to 20 | 0.4 | 15 |
| $PH_3$ (%) | 5 |  |  |  |  |
| $BF_3$ (%) |  |  |  |  | 30 |
| Bias voltage (V) | 0 | 0 | −80 to −200 | 0 | 0 |
| Substrate temperature (° C.) | 220 | 250 | 200 | 220 | 150 |
| Pressure (Pa) | 1000 | 1000 | 1000 | 1000 | 1000 |
| High frequency power (kW) | 0.2 (RF) | 1.2 (VHF) | 6 (VHF) | 0.2 (RF) | 1.5 (RF) |
| Interelectrode distance (mm) | 10 | 15 | 6 | 15 | 10 |
| Film thickness (nm) | 30 | 10 | 2000 | 10 | 10 |

TABLE 4

|  | Film forming time (hr) | | | | | | | | | | |
|---|---|---|---|---|---|---|---|---|---|---|---|
|  | 0 | 5 | 10 | 15 | 20 | 25 | 30 | 35 | 40 | 45 | 50 |
| Area ratio (%) | 100 | 98 | 95 | 93 | 90 | 88 | 86 | 85 | 84 | 83 | 82 |
| Raman intensity ratio (region composed of microcrystalline silicon) | >5 | >5 | >5 | >5 | >5 | >5 | >5 | >5 | >5 | >5 | >5 |
| Raman intensity ratio (region composed of amorphous silicon) | <1 | <1 | <1 | <1 | <1 | <1 | <1 | <1 | <1 | <1 | <1 |
| Voc | Excellent | Excellent | Excellent | Excellent | Excellent | Excellent | Excellent | Excellent | Excellent | Excellent | Excellent |
| Jsc | Excellent | Excellent | Excellent | Excellent | Excellent | Excellent | Excellent | Excellent | Excellent | Excellent | Excellent |
| FF | Excellent | Excellent | Excellent | Excellent | Excellent | Excellent | Excellent | Excellent | Excellent | Excellent | Excellent |
| Conversion efficiency | Excellent | Excellent | Excellent | Excellent | Excellent | Excellent | Excellent | Excellent | Excellent | Excellent | Excellent |
| Light degradation ratio | Excellent | Excellent | Excellent | Excellent | Excellent | Excellent | Excellent | Excellent | Excellent | Excellent | Excellent |

Table 4 clearly shows that the use of the control method of the present invention during the continuous formation of the deposited film inhibits the change of the ratio of the area of the region composed of microcrystalline silicon to the total area and that thus a reduction in the characteristics of the solar cell is effectively suppressed.

Third Embodiment

In this embodiment, a plurality of substrates are used. Deposited films are intermittently formed on the substrates. Plasma-enhanced CVD is interrupted during a step of replacing the substrate with new one. In such a case, the deposited film is formed according to the following procedure in order to check the effect of the present invention.

Substrates 1 to 5 are used. Each substrate is the same as that in the first embodiment, except that each substrate has a length of 300 mm. After the formation of a deposited film on the first substrate, Substrate 1 is replaced with Substrate 2.

When the deposited film is formed, the stationary film formation is performed in the i-type-layer-forming chamber at the front ends and the rear ends of Substrates 1 to 5. The surfaces of the stationary film formation portions are visually observed from an observation window (not shown) attached to the winding chamber 506 when the substrate is wound up to the winding bobbin 505 in the winding chamber 506. The bias voltage is controlled in the range of −100 V to −250 V so as not to reduce the ratio of the area of the region composed of microcrystalline silicon to the total area. The flow rate of a dilution hydrogen gas is controlled in the range of 10 slm to 20 slm. A preliminary experiment has been performed to determine the relationship between the ratio of the area of the region composed of microcrystalline silicon to the total area and the bias voltage and between the ratio and the flow rate of the dilution hydrogen gas. The bias voltage and between the ratio and the flow rate of the dilution hydrogen gas are controlled on the basis of the correlation.

Samples of a solar cell (single cell) having the pin structure shown in FIG. 3 are formed as in the first embodiment except for the stationary film formation portions. The samples are evaluated as in the first embodiment.

Table 6 shows the results.

Tables 6 and 7 clearly show that the use of the control method of the present invention during the intermittent formation of the deposited film inhibits the change of the ratio of

TABLE 5

|  | n-Type layer | n/i Buffer layer | i-Type layer | p/i Buffer layer | p-Type layer |
|---|---|---|---|---|---|
| Gas species and flow rate |  |  |  |  |  |
| $SiH_4$ (sccm) | 30 | 15 | 750 | 50 | 50 |
| $SiF_4$ (sccm) |  |  | 600 |  |  |
| $H_2$ (slm) | 3.6 | 4 | 10 to 20 | 0.4 | 15 |
| $PH_3$ (%) | 5 |  |  |  |  |
| $BF_3$ (%) |  |  |  |  | 30 |
| Bias voltage (V) | 0 | 0 | −100 to −250 | 0 | 0 |
| Substrate temperature (° C.) | 220 | 250 | 200 | 220 | 150 |
| Pressure (Pa) | 1000 | 1000 | 1100 | 1000 | 1000 |
| High frequency power (kW) | 0.2 (RF) | 1.2 (VHF) | 7 (VHF) | 0.2 (RF) | 1.5 (RF) |
| Interelectrode distance (mm) | 10 | 15 | 6 | 15 | 10 |
| Film thickness (nm) | 30 | 10 | 2000 | 10 | 10 |

TABLE 6

| | Substrate No. | | | | | | | | | |
|---|---|---|---|---|---|---|---|---|---|---|
| | 1 | | 2 | | 3 | | 4 | | 5 | |
| | Initial | End | Initial | End | Initial | End | Initial | End | Initial | End |
| Area ratio (%) | 100 | 95 | 92 | 90 | 87 | 85 | 82 | 80 | 77 | 75 |
| Voc | Excellent | Excellent | Excellent | Excellent | Excellent | Excellent | Excellent | Excellent | Excellent | Excellent |
| Jsc | Excellent | Excellent | Excellent | Excellent | Excellent | Excellent | Excellent | Excellent | Good | Good |
| FF | Excellent | Excellent | Excellent | Excellent | Excellent | Excellent | Excellent | Excellent | Excellent | Excellent |
| Conversion efficiency | Excellent | Excellent | Excellent | Excellent | Excellent | Excellent | Excellent | Excellent | Excellent | Excellent |
| Light degradation ratio | Excellent | Excellent | Excellent | Excellent | Excellent | Excellent | Excellent | Excellent | Good | Good |

First Comparative Embodiment

A deposited film is formed as in the third embodiment, except that the deposition-film-forming conditions on the basis of the observation results of the ratio of the area of the region composed of microcrystalline silicon to the total area deposited by the stationary film formation are not controlled. Substrates 1 to 5 are used. Deposited films are intermittently formed on the substrates. Plasma-enhanced CVD is interrupted for 60 minutes during a step of replacing the substrate with new one. Samples of a solar cell are formed as in the third embodiment. The samples are evaluated as in the first embodiment.

Table 7 shows the results.

the area of the region composed of microcrystalline silicon to the total area and that thus a reduction in the characteristics of the solar cell is effectively suppressed.

Fourth Embodiment

In this embodiment, a solar cell (double cell) having a pin (top layer)/pin (bottom layer) structure shown in FIG. 1 is formed under the deposition-film-forming conditions shown in Tables 8 and 9. Samples are formed as in the second and third embodiments and the first comparative embodiment, except for the layer structure. The same evaluation is performed.

TABLE 7

| | Substrate No. | | | | | | | | | |
|---|---|---|---|---|---|---|---|---|---|---|
| | 1 | | 2 | | 3 | | 4 | | 5 | |
| | Initial | End | Initial | End | Initial | End | Initial | End | Initial | End |
| Area ratio (%) | 100 | 95 | 85 | 80 | 70 | 65 | 55 | 50 | 45 | 40 |
| Voc | Excellent | Excellent | Excellent | Excellent | Excellent | Excellent | Excellent | Excellent | Excellent | Excellent |
| Jsc | Excellent | Excellent | Excellent | Excellent | Good | Good | Good | Good | Fair | Poor |
| FF | Excellent | Excellent | Excellent | Excellent | Good | Good | Good | Good | Fair | Fair |
| Conversion efficiency | Excellent | Excellent | Excellent | Excellent | Excellent | Good | Good | Good | Fair | Fair |
| Light degradation ratio | Excellent | Excellent | Excellent | Excellent | Good | Good | Good | Good | Fair | Poor |

In this embodiment, however, the crystal system of the i-type layer of the top layer is amorphous, and the crystal system of the i-type layer of the bottom layer is microcrystalline. That is, the control of the present invention is performed only during the formation of the bottom layer. After the formation of the bottom layer, the top layer is formed by the known method. Each of the bottom layer and the top layer is formed with the apparatus shown in FIG. 5 for forming a deposited film, the apparatus being designed for the formation of the corresponding layer.

The results demonstrate that the present invention is also effective in producing the double-structure solar cell as in the second and third embodiments and the first comparative embodiment.

Fifth Embodiment

In this embodiment, a solar cell (triple cell) having a pin (top layer)/pin (middle layer)/pin (bottom layer) structure shown in FIG. 2 is formed under the deposition-film-forming conditions shown in Tables 10, 11, and 12. Samples are formed as in the second and third embodiments and the first comparative embodiment, except for the layer structure. The same evaluation is performed.

In this embodiment, however, the crystal system of the i-type layer of the top layer is amorphous, and the crystal system of the i-type layer of each of the bottom and middle layers is microcrystalline. That is, the control of the present invention is performed only during the formation of the bot-

TABLE 8

| | Top layer | | | | |
|---|---|---|---|---|---|
| | n-Type layer | n/i Buffer layer | i-Type layer | p/i Buffer layer | p-Type layer |
| Gas species and flow rate | | | | | |
| $SiH_4$ (sccm) | 25 | 15 | 500 | 15 | 15 |
| $SiF_4$ (sccm) | | | | | |
| $H_2$ (slm) | 1 | 4 | 5 | 1 | 5 |
| $PH_3$ (%) | 20 | | | | |
| $BF_3$ (%) | | | | | 30 |
| Bias voltage (V) | 0 | 0 | 0 | 0 | 0 |
| Substrate temperature (° C.) | 250 | 220 | 240 | 220 | 150 |
| Pressure (Pa) | 200 | 200 | 200 | 200 | 200 |
| High frequency power (kW) | 0.1 (RF) | 0.3 (RF) | 0.4 (VHF) | 0.8 (RF) | 2 (RF) |
| Interelectrode distance (mm) | 20 | 20 | 10 | 20 | 15 |
| Film thickness (nm) | 10 | 10 | 300 | 10 | 5 |

TABLE 9

| | Bottom layer | | | | |
|---|---|---|---|---|---|
| | n-Type layer | n/i Buffer layer | i-Type layer | p/i Buffer layer | p-Type layer |
| Gas species and flow rate | | | | | |
| $SiH_4$ (sccm) | 100 | 15 | 400 | 40 | 20 |
| $SiF_4$ (sccm) | | | 400 | | |
| $H_2$ (slm) | 2 | 4 | 5 to 15 | 1 | 5 |
| $PH_3$ (%) | 15 | | | | |
| $BF_3$ (%) | | | | | 30 |
| Bias voltage (V) | 0 | 0 | −80 to −200 | 0 | 0 |
| Substrate temperature (° C.) | 250 | 250 | 200 | 220 | 150 |
| Pressure (Pa) | 1000 | 1000 | 1000 | 1000 | 1000 |
| High frequency power (kW) | 0.2 (RF) | 1.2 (VHF) | 5 (VHF) | 0.2 (RF) | 1.5 (RF) |
| Interelectrode distance (mm) | 20 | 20 | 10 | 20 | 15 |
| Film thickness (nm) | 10 | 10 | 300 | 10 | 5 | tom and middle layers. After the formation of the bottom and middle layers, the top layer is formed by the known method. Each of the bottom, middle, and top layers is formed with the apparatus shown in FIG. 5 for forming a deposited film, the apparatus being designed for the formation of the corresponding layer.

The results demonstrate that the present invention is also effective in producing the triple-structure solar cell as in the second and third embodiments and the first comparative embodiment.

Sixth Embodiment

In this embodiment, in order to check the effect of the present invention on long-term stable use, the maintenance of an apparatus is performed on the basis of the ratio of the area of the region composed of microcrystalline silicon to the total area, in the course of the process for continuously forming a deposited film.

TABLE 10

Top layer

| | n-Type layer | n/i Buffer layer | i-Type layer | p/i Buffer layer | p-Type layer |
|---|---|---|---|---|---|
| Gas species and flow rate | | | | | |
| SiH$_4$ (sccm) | 25 | 15 | 500 | 15 | 15 |
| SiF$_4$ (sccm) | | | | | |
| H$_2$ (slm) | 1 | 4 | 5 | 1 | 5 |
| PH$_3$ (%) | 20 | | | | |
| BF$_3$ (%) | | | | | 30 |
| Bias voltage (V) | 0 | 0 | 0 | 0 | 0 |
| Substrate temperature (° C.) | 250 | 220 | 240 | 220 | 150 |
| Pressure (Pa) | 200 | 200 | 200 | 200 | 200 |
| High frequency power (kW) | 0.1 (RF) | 0.3 (RF) | 0.4 (VHF) | 0.8 (RF) | 2 (RF) |
| Interelectrode distance (mm) | 20 | 20 | 10 | 20 | 15 |
| Film thickness (nm) | 10 | 10 | 300 | 10 | 5 |

TABLE 11

Middle layer

| | n-Type layer | n/i Buffer layer | i-Type layer | p/i Buffer layer | p-Type layer |
|---|---|---|---|---|---|
| Gas species and flow rate | | | | | |
| SiH$_4$ (sccm) | 100 | 15 | 400 | 40 | 20 |
| SiF$_4$ (sccm) | | | 400 | | |
| H$_2$ (slm) | 2 | 4 | 5 to 15 | 1 | 5 |
| PH$_3$ (%) | 15 | | | | |
| BF$_3$ (%) | | | | | 30 |
| Bias voltage (V) | 0 | 0 | −80 to −200 | 0 | 0 |
| Substrate temperature (° C.) | 250 | 250 | 200 | 220 | 150 |
| Pressure (Pa) | 1000 | 1000 | 1000 | 1000 | 1000 |
| High frequency power (kW) | 0.2 (RF) | 1.2 (VHF) | 5 (VHF) | 0.2 (RF) | 1.5 (RF) |
| Interelectrode distance (mm) | 10 | 15 | 5 | 15 | 10 |
| Film thickness (nm) | 30 | 10 | 2000 | 10 | 10 |

TABLE 12

Bottom layer

| | n-Type layer | n/i Buffer layer | i-Type layer | p/i Buffer layer | p-Type layer |
|---|---|---|---|---|---|
| Gas species and flow rate | | | | | |
| SiH$_4$ (sccm) | 100 | 15 | 600 | 40 | 20 |
| SiF$_4$ (sccm) | | | 500 | | |
| H$_2$ (slm) | 2 | 4 | 10 to 20 | 1 | 5 |
| PH$_3$ (%) | 15 | | | | |
| BF$_3$ (%) | | | | | 30 |
| Bias voltage (V) | 0 | 0 | −80 to −200 | 0 | 0 |
| Substrate temperature (° C.) | 250 | 250 | 200 | 220 | 150 |
| Pressure (Pa) | 1000 | 1000 | 1000 | 1000 | 1000 |
| High frequency power (kW) | 0.2 (RF) | 1.2 (VHF) | 5 (VHF) | 0.2 (RF) | 1.5 (RF) |
| Interelectrode distance (mm) | 10 | 15 | 5 | 15 | 10 |
| Film thickness (nm) | 30 | 10 | 2500 | 10 | 10 |

The deposited film is continuously formed under the conditions shown in Table 1 with the roll-to-roll apparatus illustrated in FIG. 5 while a substrate is conveyed (moved) as in the first embodiment.

The stationary film formation is performed in the i-type-layer-forming chamber every 5 hours after the initiation of the formation of the deposited film.

The surfaces of the stationary film formation portions are visually observed from an observation window (not shown) provided on the winding chamber 506 when the substrate is wound up to the winding bobbin 505 in the winding chamber 506. When the ratio of the area of the region composed of microcrystalline silicon to the total area reaches 50%, the film-forming operation is interrupted. After the maintenance of the deposition-film-forming apparatus (e.g., cleaning inside the apparatus, the replacement of the radio-frequency electrode, and the replacement of parts) is performed, the formation of the deposited film is resumed. A series of steps is repeated 10 cycles. Samples of a solar cell are formed as in the first embodiment at the initiation and completion of the film formation of each cycle. The resulting samples are evaluated as in the first embodiment. The results demonstrate that during a single cycle, although the characteristics of the samples are gradually degraded with time, the characteristics satisfy predetermined requirements even at the end of the film formation and that the characteristics are recovered after the maintenance of the film-forming apparatus. Thereby, the ratio of the area of the region composed of microcrystalline silicon of the present invention to the total area is defined as a criterion for the initiation of the maintenance of the deposition-film-forming apparatus. This is effective in stably producing such a solar cell for a prolonged period of time.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-287448 filed Oct. 23, 2006, which is hereby incorporated by reference herein in its entirety.

What is claimed is:

1. A method for forming a deposited film containing microcrystalline silicon on a moving substrate by plasma-enhanced CVD, the method comprising a step of:

forming a deposited film containing microcrystalline silicon on a moving substrate by plasma-enhanced CVD under conditions such that when a deposited film having a thickness of 300 nm or more is formed on a substrate while the substrate is in a stationary state, an area of the microcrystalline silicon region in which an intensity of Raman scattering attributed to a crystalline substance in the deposited film is equal to or higher than three times an intensity of Raman scattering attributed to an amorphous is 50% or more of the total area based on the area of the microcrystalline silicon region and the area of a region composed of the amorphous, wherein the area of microcrystalline silicon region in which the intensity of Raman scattering attributed to the crystalline substance in the deposited film is equal to or higher than three times the intensity of Raman scattering attributed to amorphous is determined by color or reflectivity corresponding to microcrystalline silicon.

2. A method for forming a photovoltaic element including at least one pin junction by plasma-enhanced CVD on a moving substrate, at least one i-type layer being formed of a deposited film containing microcrystalline silicon, the method comprising a step of:

forming the deposited film containing microcrystalline silicon on a moving substrate by plasma-enhanced CVD under conditions such that when a deposited film having a thickness of 300 nm or more is formed on a substrate while the substrate is in a stationary state, an area of the microcrystalline silicon region in which an intensity of Raman scattering attributed to a crystalline substance in the deposited film is equal to or higher than three times an intensity of Raman scattering attributed to an amorphous is 50% or more of the total area of the deposited film based on the area of the microcrystalline silicon region and the area of a region composed of the amorphous, wherein the area of microcrystalline silicon region in which the intensity of Raman scattering attributed to the crystalline substance in the deposited film is equal to or higher than three times the intensity of Raman scattering attributed to amorphous is determined by color or reflectivity corresponding to microcrystalline silicon.

3. A method for forming a deposited film containing microcrystalline silicon on a moving substrate by plasma-enhanced CVD, the method comprising:

a first step of forming a deposited film while a substrate is being moved in plasma CVD;

a second step of forming a deposited film while the substrate is being moved; and a third step of forming a deposited film while the substrate is in a stationary state, the third step being performed before the first step or between the first step and the second step, wherein conditions for forming the deposited film while the substrate is being moved are controlled on the basis of the ratio of an area of the microcrystalline silicon region in which an intensity of Raman scattering attributed to a crystalline substance in the deposited film is equal to or higher than three times an intensity of Raman scattering attributed to an amorphous to the total area based on the area of the microcrystalline silicon region and the area of a region composed of the amorphous when the deposited film having a thickness of 300 nm or more is formed on the substrate while the substrate is in a stationary state in the third step.

4. A method for forming a deposited film containing microcrystalline silicon on a moving substrate by plasma-enhanced CVD, the method comprising:

a first step of forming a deposited film while a substrate is being moved in plasma CVD;

a second step of forming a deposited film while the substrate is being moved; and a third step of forming a deposited film while the substrate is in a stationary state, the third step being performed before the first step or between the first step and the second step, wherein the maintenance of a deposition-film-forming apparatus is performed on the basis of the ratio of an area of the microcrystalline silicon region in which an intensity of Raman scattering attributed to a crystalline substance in the deposited film is equal to or higher than three times an intensity of Raman scattering attributed to an amorphous to the total area based on the area of the microcrystalline silicon region and the area of a region composed of the amorphous when the deposited film having a thickness of 300 nm or more is formed on the substrate while the substrate is in a stationary state in the third step.

* * * * *